(12) United States Patent
Richards et al.

(10) Patent No.: US 7,411,792 B2
(45) Date of Patent: Aug. 12, 2008

(54) THERMAL SWITCH, METHODS OF USE AND MANUFACTURING METHODS FOR SAME

(75) Inventors: Robert F. Richards, Pullman, WA (US);
David F. Bahr, Pullman, WA (US);
Cecilia Richards, Pullman, WA (US)

(73) Assignee: Washington State University Research Foundation, Pullman, WA (US)

( * ) Notice: Subject to any disclaimer, the term of this patent is extended or adjusted under 35 U.S.C. 154(b) by 351 days.

(21) Appl. No.: 10/535,315

(22) PCT Filed: Nov. 18, 2003

(86) PCT No.: PCT/US03/36869

§ 371 (c)(1),
(2), (4) Date: May 18, 2005

(87) PCT Pub. No.: WO2004/047133

PCT Pub. Date: Jun. 3, 2004

(65) Prior Publication Data

US 2006/0066434 A1    Mar. 30, 2006

Related U.S. Application Data

(60) Provisional application No. 60/427,619, filed on Nov. 18, 2002.

(51) Int. Cl.
*F28F 27/00*    (2006.01)
*F25D 29/00*    (2006.01)

(52) U.S. Cl. .................... 361/704; 361/707; 361/709; 361/710; 165/276; 62/383

(58) Field of Classification Search .............. 361/704, 361/707, 709, 710; 165/276; 62/383
See application file for complete search history.

(56) References Cited

U.S. PATENT DOCUMENTS

| 3,225,820 | A | * | 12/1965 | Riordan | ................. 165/96 |
| 3,430,455 | A | * | 3/1969 | Hogan et al. | ................. 62/383 |
| 3,519,067 | A | | 7/1970 | Schmidt | |
| 3,531,752 | A | * | 9/1970 | Gourley | ................. 337/139 |
| 3,643,734 | A | | 2/1972 | Deschamps | |
| 4,092,697 | A | | 5/1978 | Spaight | |
| 4,129,881 | A | | 12/1978 | Reichel et al. | |
| 4,212,346 | A | | 7/1980 | Boyd | |
| 4,254,431 | A | | 3/1981 | Babuka et al. | |
| 4,742,867 | A | | 5/1988 | Walsh | |
| 4,770,004 | A | * | 9/1988 | Lagodmos | ................. 62/383 |

(Continued)

*Primary Examiner*—Anatoly Vortman
(74) *Attorney, Agent, or Firm*—Michael J Donohue; Davis Wright Tremaine LLP

(57) ABSTRACT

The present disclosure concerns embodiments of a thermal switch used to control the transfer of heat from a heat source to a heat sink. According to one aspect, the thermal switch can be activated, or turned "on", so as to establish a path of low thermal resistance between the heat source and the heat sink to facilitate the transfer of heat therebetween. The thermal switch can also be de-activated, or turned "off", so as to establish a path of high thermal resistance between the heat source and the heat sink to minimize or totally prevent the transfer of heat between the heat source and heat sink. In certain embodiments, the thermal switch includes at least drop of a thermally conductive liquid that thermally couples the heat source to the heat sink whenever the switch is activated.

17 Claims, 12 Drawing Sheets

U.S. PATENT DOCUMENTS

| | | |
|---|---|---|
| 4,858,678 A | 8/1989 | Ladd |
| 5,170,930 A | 12/1992 | Dolbear et al. |
| 5,379,601 A | 1/1995 | Gillett |
| 5,459,352 A | 10/1995 | Layton et al. |
| 5,808,874 A | 9/1998 | Smith |
| 6,191,944 B1 | 2/2001 | Hammel et al. |
| 6,276,144 B1 * | 8/2001 | Marland et al. .............. 62/51.1 |
| 6,281,573 B1 | 8/2001 | Atwood et al. |
| 6,305,174 B1 * | 10/2001 | Binneberg et al. ................ 62/6 |
| 6,351,952 B1 | 3/2002 | Baker, III |
| 6,392,890 B1 | 5/2002 | Katchmar |
| 6,437,240 B2 | 8/2002 | Smith |
| 6,665,186 B1 | 12/2003 | Calmidi et al. |
| 6,768,412 B2 * | 7/2004 | Becka et al. ................... 337/36 |
| 7,154,369 B2 * | 12/2006 | Dietz et al. ................. 337/394 |
| 2003/0230403 A1 | 12/2003 | Webb |

\* cited by examiner

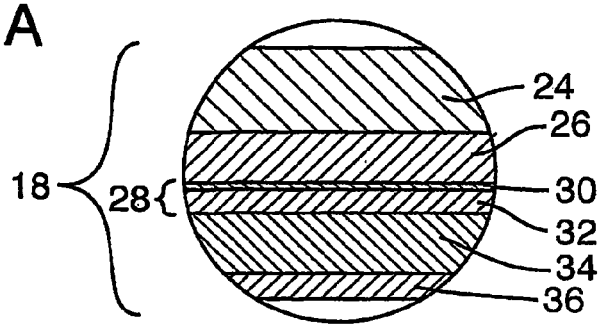
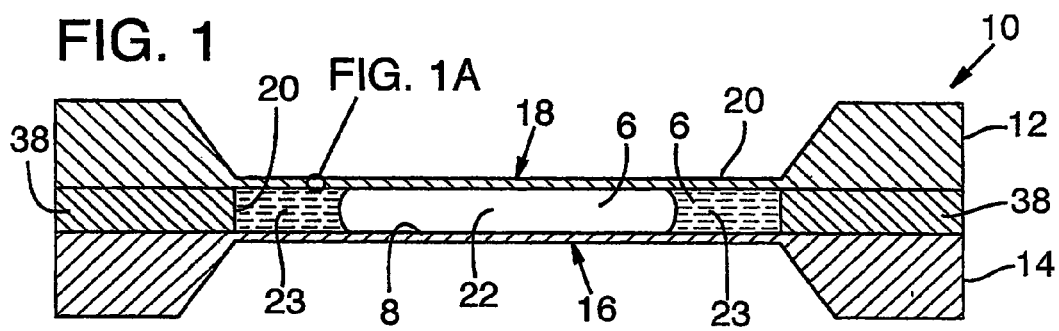
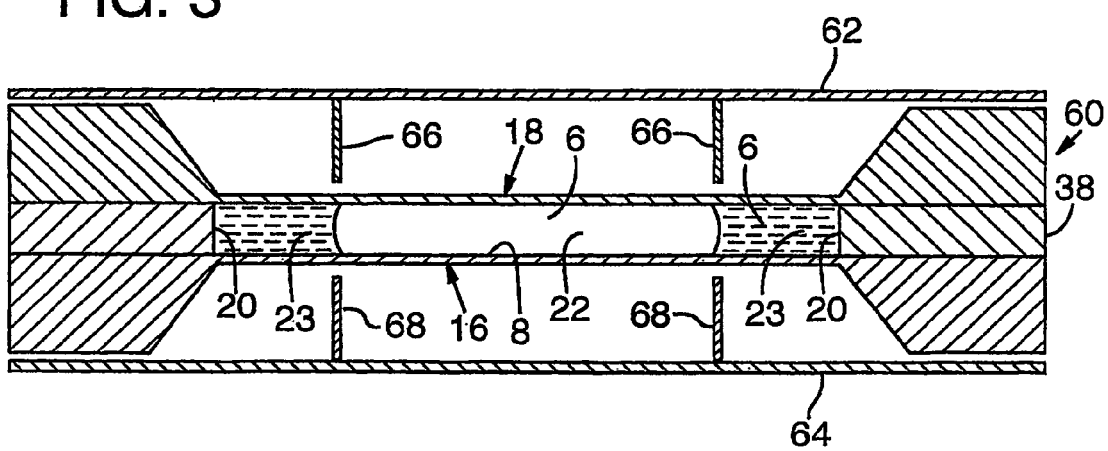

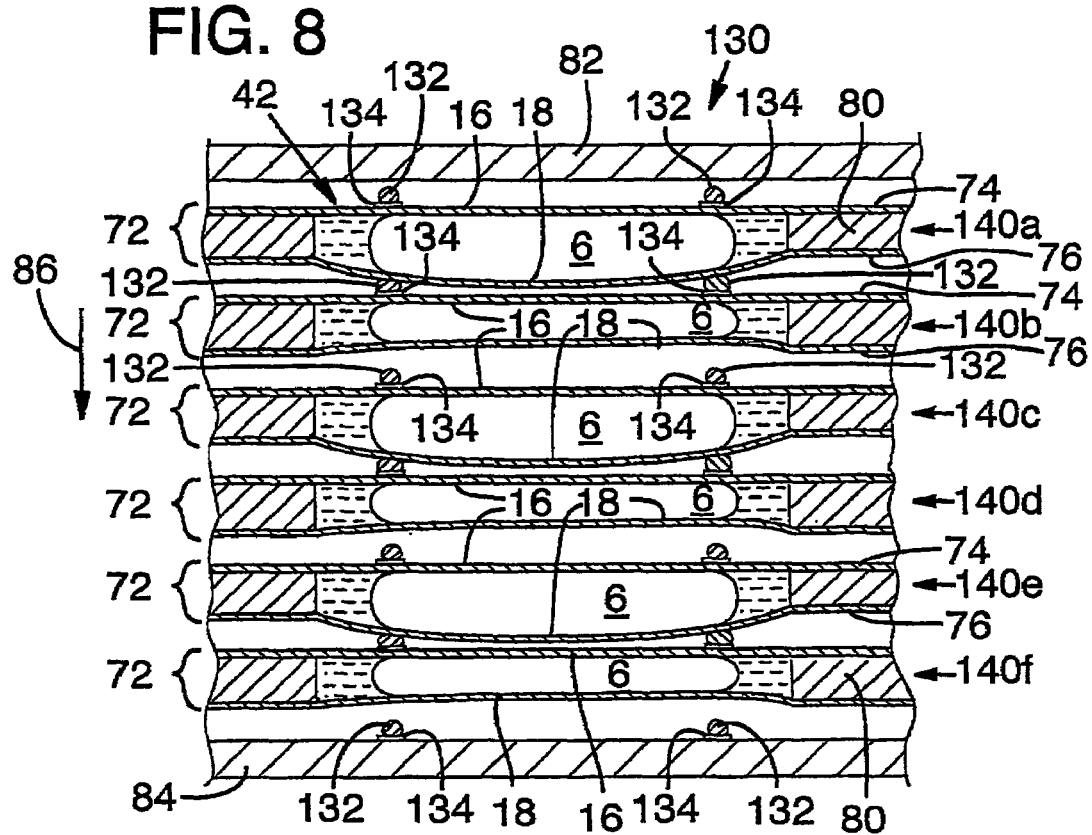

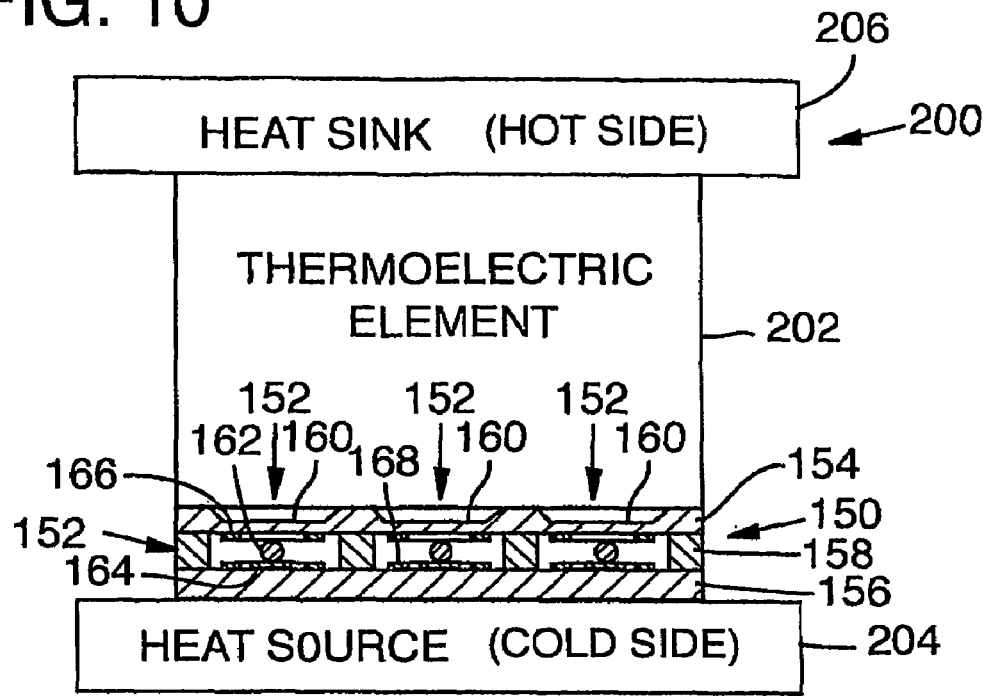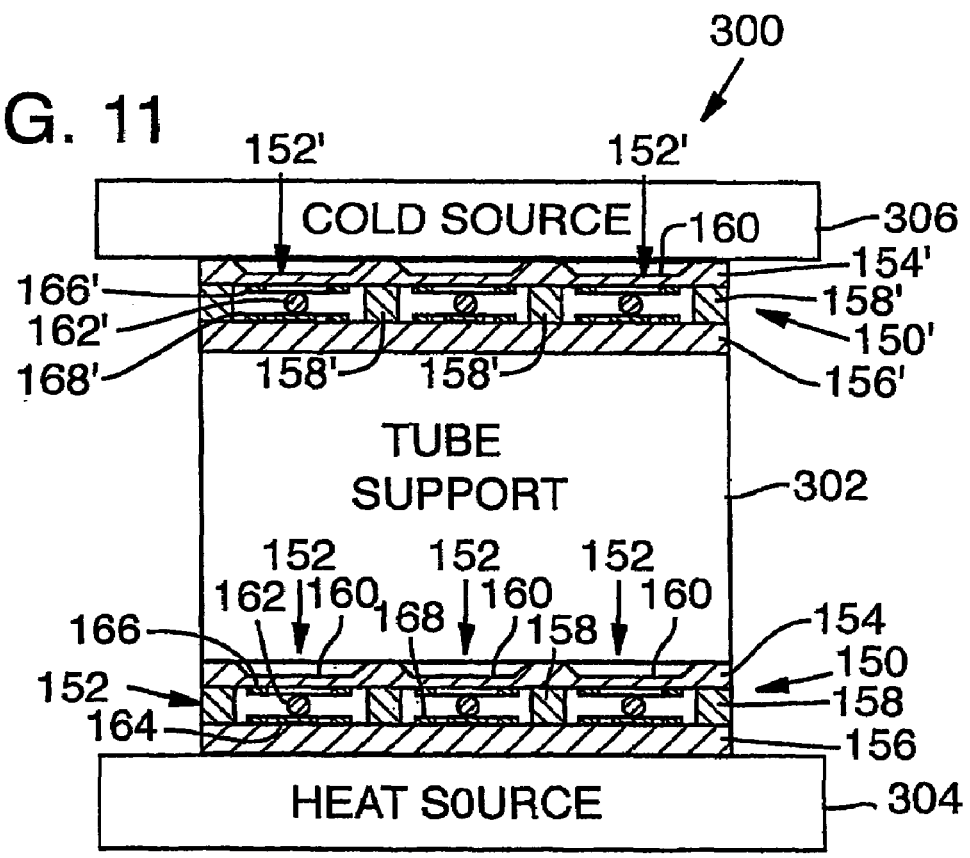

THERMAL SWITCH, METHODS OF USE AND MANUFACTURING METHODS FOR SAME

CROSS-REFERENCE TO RELATED APPLICATION

The present application claims the benefit of prior U.S. provisional application No. 60/427,619, filed on Nov. 18, 2002, which is incorporated herein by reference.

FEDERAL SUPPORT

This invention was developed with support under Grant Number 99-80-837 from the National Science Foundation, Contract Number DASG60-02-C-0001 from the Defense Research Projects Agency, and Contract Number DASG60-02-C-0084 from the U.S. Army Space and Missile Defense Command. The U.S. government has certain rights in this invention.

FIELD

This invention relates generally to embodiments of a thermal switch that can be used, for example, to control the heat transfer into and out of mechanical, electrical, and electromechanical devices.

BACKGROUND

The need for miniaturized power sources for micro-electro-mechanical systems (MEMS) and micro-electronics has long been recognized. Much work has already been done on micro-scale batteries, and micro-scale heat engines. Micro-scale heat engines are a particularly attractive option, because of the very high density energy storage afforded by the hydrocarbon fuels they burn. Thus, a micro-heat engine which could convert the chemical energy stored in a hydrocarbon fuel to mechanical or electrical energy could form the basis of a very compact power supply.

Piezoelectric thin films have been used for years as power transducers in MEMS and micro-electronic devices. Piezoelectric films are an attractive option for power transduction because of the relative ease with which such devices can be produced using conventional micro-machining methods. Generally speaking, micro-machining involves processing techniques, such as microlithography and etching, that were developed and refined for use in the manufacture of integrated circuits. Micro-machining allows fine control of dimensions and is commonly employed for producing parts from silicon. However, micro-machining is not restricted in its application to the formation of workpieces from silicon or other materials conventionally used in the manufacture of integrated circuits, and it is known to apply micro-machining to other materials.

In most applications of piezoelectric films, such as in micro-actuators, pumps, and valves, electrical power is converted to mechanical power. Micro-sensors that utilize piezoelectric films also have been used for mechanical-to-electrical transduction, however, such devices are not capable of producing usable electrical power to any significant degree. Thus, it would be desirable to utilize piezoelectric thin films for converting energy in one form, such as thermal energy or kinetic energy, to useful electrical energy to power MEMS and micro-electronic devices.

Along with the need for miniaturized power sources is the need for micro-devices that are designed to remove heat from MEMS and micro-electronics. In particular, integrated-circuit manufacturers are already reaching limits on micro-processor speed and performance imposed by high operating temperatures. Consequently, reducing the operating temperatures of chips by removing waste heat through active cooling is considered to be among the most promising strategies available to the microprocessor industry for overcoming these obstacles. Thus, it would be desirable to implement a piezoelectric film in a micro-heat pump for cooling applications of MEMS and micro-electronics.

Many MEMS devices have been developed that rely on thermal energy for actuation. This energy can be supplied in a variety of ways. For example, there are micro-systems that receive heat from electrical resistance heaters, external sources, and chemical reactions. The ability to control the heat transfer into and out of these MEMS devices is essential to their performance. The necessity for precise thermal management is especially critical for micro-devices that operate at high frequencies, such as micro-thermopneumatic pumps, bi-layer electrical relays, and micro-heat engines. Often, it is the inability to rapidly reject heat that limits the operating frequencies of such devices. Thus, there is a strong need for a thermal switch that enables the precise control of heat transfer into and out of such MEMS devices.

SUMMARY

The present disclosure concerns embodiments of a thermal switch that is used to control the transfer of heat from a heat source to a heat sink. As used herein, the term "heat source" is used to refer to anything that gives off or rejects heat. The term "heat sink" is used to refer to anything that accepts or absorbs heat. According to one aspect, the thermal switch can be activated, or turned "on", so as to establish a path of low thermal resistance between the heat source and the heat sink to facilitate the transfer of heat therebetween. The thermal switch can also be de-activated, or turned "off", so as to establish a path of high thermal resistance between the heat source and the heat sink to minimize or totally prevent the transfer of heat between the heat source and heat sink.

The thermal switch can be implemented to control the flow of heat into and out of various mechanical, electrical, or electromechanical devices. In one implementation, for example, thermal switches control the flow of heat into and out of a micro-transducer, such as a micro-heat engine or a micro-heat pump. One thermal switch periodically thermally couples the micro-transducer to a heat source to allow heat to flow into the micro-transducer. Another thermal switch periodically thermally couples the micro-transducer to a heat sink to allow the micro-transducer to reject heat to the heat sink.

The micro-transducer can be arranged in a cascade of multiple micro-transducers, each operating over its own temperature range. The micro-transducers are thermally coupled to each other with thermal switches. Thus, in this configuration, heat rejected by one micro-transducer is transferred to another micro-transducer in an adjacent level of the cascade whenever a respective thermal switch thermally couples the micro-transducers to each other.

In particular embodiments, the thermal switch includes at least one drop of a thermally conductive liquid, such as a liquid metal or liquid-metal alloy, positioned between the opposed surfaces of first and second thermally conductive members. The thermal switch is activated by bringing the drop into contact with the two surfaces, which allows heat to be conducted from one thermally conductive member to the other thermally conductive member through the drop. The thermal switch is de-activated by creating a gap between the drop and one of the surfaces, which increases the thermal resistance between the surfaces, thereby minimizing heat transfer.

The direction of heat transfer through the switch depends on the particular application in which the switch is being used. For example, if the first thermally conductive member is thermally coupled to a heat source and the second thermally conductive member is thermally coupled to a heat sink, heat is transferred from the first thermally conductive member to the second thermally conductive member through the drop whenever the thermal switch is activated.

The thermal switch can include an actuator that is operable to selectively activate and de-activate the thermal switch. In one embodiment, for example, the first thermally conductive member serves as a base for supporting the liquid drop and the second thermally conductive member is a deflectable actuator, such as an electrostatic or piezoelectric transducer. In its normal, non-deflected position, the actuator is spaced from the drop to minimize heat transfer between the actuator and the base. To activate the thermal switch, the actuator is caused to deflect inwardly and contact the drop, thereby establishing a path of high thermal conductance between the actuator and the base. To de-activate the switch, the actuator is allowed to return to its non-deflected position.

In another embodiment, a thermal switch is operable to control the flow of heat into or away from a body. The thermal switch includes a drop of a thermally conductive liquid and an activation element The activation element is selectively movable between a first position to activate the thermal switch and to allow heat to flow into or away from the body, and a second position to de-activate the thermal switch to minimize the flow of heat into or away from the body.

According to another embodiment, a thermal switch assembly comprises a first major layer and a second major layer. A plurality of thermal switch elements are cooperatively formed between the first and second switch elements. Each thermal switch element is selectively operable independently of each other to increase and decrease the transfer of heat between the first and second major layers.

In yet another embodiment, a thermal switch transfers heat from one surface to another surface of the switch through evaporation and condensation of a working fluid, in a manner similar to a conventional heat pipe. The thermal switch in this embodiment comprises a body that defines a fluid-tight cavity for containing the working fluid. A flexible membrane forms a wall of the cavity and is deflectable inwardly toward an opposed surface of cavity. The inner surface of the flexible membrane mounts one or more wicks configured to wick up working fluid that has condensed on the opposed surface of the cavity. During operation, heat applied to the flexible membrane causes fluid carried by the wicks to evaporate. The vapor flows across the switch and condenses on the opposed surface of the cavity, giving up latent heat. When all of the liquid on the wicks has evaporated, the flexible membrane is activated to deflect inwardly to cause liquid that has condensed to wick up onto the wicks.

Other applications for thermal switches are also disclosed. For example, a thermal switch can be used to control the transfer of heat in a thermoelectric cooler. In one representative embodiment, a thermoelectric cooler comprises a low-temperature heat source, a high-temperature heat sink, and a thermoelectric element that is thermally coupled to the high-temperature heat sink. A thermal switch comprising at least one drop of a thermally conductive liquid is configured to selectively thermally couple the low-temperature heat source to the thermoelectric element. By selectively thermally coupling the heat source to the thermoelectric element, the transfer of Joule heat to the heat source is avoided, which results in an overall increase in net cooling.

In another application, one or more thermal switches can be used to selectively thermally couple a heat source and a cold source to micro-tubes of a thermal cycler, such as used to perform PCR analysis on DNA samples. According to one representative embodiment, a thermal cycler comprises a tube-support device that supports one or more micro-tubes for containing a sample to be processed by the thermal cycler. A heat source is configured to supply heat to the samples in the micro-tubes, and a cold source is configured to supply cold to the samples in the micro-tubes. A thermal switch is configured to selectively thermally couple at least one of the heat source and cold source to the micro-tubes.

The foregoing and other features and advantages of the invention will become more apparent from the following detailed description of several embodiments, which proceeds with reference to the accompanying figures.

BRIEF DESCRIPTION OF THE DRAWINGS

FIG. 1 shows an enlarged cross-sectional view of a piezoelectric micro-transducer according to one embodiment of the present invention.

FIG. 3 shows an enlarged cross-sectional view of a piezoelectric micro-heat pump having the same general construction of the micro-transducer of FIG. 1, shown operating between a low-temperature heat source and a high-temperature heat sink.

FIG. 8 is a partial, sectional view of an another embodiment of an apparatus comprising arrays of piezoelectric micro-heat engines stacked superposedly in a cascade, in which micro-droplet thermal switches control the flow of heat into and out of the micro-heat engines.

FIG. 10 is a schematic illustration of a thermoelectric cooler, according to one embodiment, that includes a thermal switch assembly to control the transfer of heat between the cold side of the thermoelectric cooler and the thermoelectric element of the thermoelectric cooler.

FIG. 11 is a schematic illustration of a thermal cycler, according to one embodiment, that includes thermal switch assemblies to control the flow of heat and cold to samples contained in micro-tubes supported in the thermal cycler.

FIGS. 12A and 12B is defined between the micro-heat engines.

DETAILED DESCRIPTION

Figure 2A:
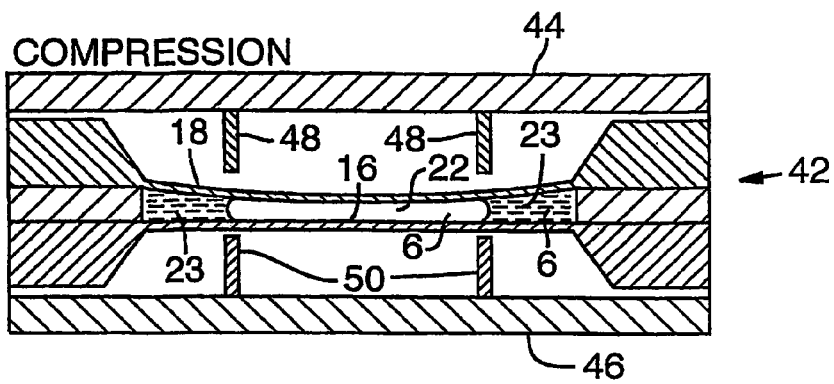
FIGS. 2A-2D illustrate the thermodynamic cycle of a piezoelectric micro-heat engine having the same general construction of the micro-transducer of FIG. 1, shown operating between a high-temperature heat source and a low-temperature heat sink.

As used herein, the singular forms "a," "an," and "the" refer to one or more than one, unless the context clearly dictates otherwise.

As used herein, the term "includes" means "comprises."

As used in this description, the term "transducer" is used to denote a device for converting useful energy in one form to useful energy in another form. For example, energy may be converted from the energy of mechanical motion to an electric current or from thermal energy to mechanical motion. Additionally, it is known that many transducers that can be operated in one mode can also be operated in a reverse mode. As an example, a device may be operated both as an electrical motor to convert energy from electric current to mechanical motion, or it may be operated as a generator to convert mechanical motion to electric current.

As used herein, "piezoelectric materials" refer to those materials in which a mechanical stress applied as a result of, for example, bending, deflection, or flexure, produces an electrical polarization, and conversely, an applied electric field induces a mechanical strain that causes a mechanical displacement of the material (e.g., in the form of bending, deflection, or flexure).

As used herein, the term "substrate" refers to any support material from which one or more micro-transducers can be constructed and is not limited to materials, such as silicon wafers, conventionally used in the manufacture of semiconductor devices.

As used herein, the term "body" refers to anything that can function as a heat source by rejecting or giving off heat and/or as a heat sink by accepting or absorbing heat.

Micro-Heat Engine/Micro-Heat Pump

According to one aspect, a micro-transducer can be used either as a micro-heat engine to convert thermal energy, flowing from a higher temperature to a lower temperature, into electric current or as a micro-heat pump, i.e., a micro-refrigerator, that consumes electric energy to pump thermal energy from a lower temperature to a higher temperature. The micro-transducer has particular applicability for use as a micro-heat engine for providing electrical power to MEMS or micro-electronic devices, for example, or as a micro-heat pump to remove heat from MEMS or micro-electronic devices.

FIG. 1 shows an enlarged cross section of a micro-transducer 10 according to a one embodiment. The micro-transducer 10 in the illustrated configuration has a cell-like structure that comprises a first major layer 12 and a second major layer 14. The micro-transducer 10 has a generally rectangular shape, although in other embodiments the micro-transducer 10 may be circular or any of other various shapes. In a working embodiment, the first and second major layers 12 and 14 comprise silicon wafers. However, the micro-transducer 10 may be fabricated from materials other than silicon, such as quartz, sapphire, plastic, ceramic, or a thin-film metal such as aluminum. Methods for manufacturing the micro-transducer 10 from a silicon wafer or other equivalent material are described in detail below.

A fluid cavity 8 is cooperatively formed between the first major layer 12 and the second major layer 14. In the present embodiment, for example, the fluid cavity 8 is bounded by a first membrane 18 (shown as an upper membrane 18 in FIG. 1) of the micro-transducer 10, a second membrane 16 (shown as a lower membrane 16 in FIG. 1) of the micro-transducer 10, and side walls 20. The second membrane 16 comprises a recessed portion, or an area of reduced thickness, defined in the second major layer 14. The first membrane 18 similarly comprises a recessed portion, or an area of reduced thickness. The side walls 20 are defined by a generally rectangular aperture formed in an intermediate layer 38 disposed between the first major layer 12 and the second major layer 14.

A working fluid 6 is contained within the fluid cavity 8. As shown in FIG. 1, the working fluid 6 may comprise two phases including a saturated vapor 22 and a saturated liquid 23. Desirably, the working fluid employed in the micro-transducer 10 is selected so that it remains a saturated liquid-vapor mixture throughout the thermodynamic cycle of the micro-transducer 10. The selection of the particular two-phase working fluid will depend upon the working temperatures of the micro-transducer 10. For example, in relatively low-temperature applications (i.e., less than 200° F.;), refrigerants such as R11 have proven to be suitable. In moderate-temperature applications (i.e., above 200° F.), water may be used as the two-phase working fluid. Although less desirable for reasons explained below, the working fluid 6 may be comprised entirely of a vapor or a liquid.

In any event, the use of a two-phase working fluid is significant in that the thermal efficiency attained by the transducer approaches that of the ideal Carnot cycle. In conventional large-scale heat engines and heat pumps, two-phase fluids cannot be used because surface tension causes the liquid portion of a two-phase saturated mixture to form small droplets that can quickly destroy thermal machinery during expansion and compression processes. In the present embodiment, however, the use of a two-phase working fluid is possible because of the surface tension forces that occur on the micro-scale.

Specifically, and as shown in FIG. 1, surface tension causes the liquid portion 23 to separate from the vapor portion 22 and adhere to the inside walls 20 of the transducer 10 so as to prevent the formation of liquid droplets that would otherwise harm the transducer.

In FIG. 1A, the depicted magnified section of FIG. 1 illustrates that the first membrane 18 desirably includes a support layer 24 which comprises the material of the first major layer 12 (e.g., silicon in the present example). An optional silicon oxide layer 26 is juxtaposed to the support layer 24; a first electrode 28 (shown as a top electrode in FIG. 1A) is juxtaposed to the oxide layer 26; a piezoelectric member or layer 34 is juxtaposed to the top electrode; and a second electrode 36 (shown as a bottom electrode in FIG. 1A) is juxtaposed to the bottom electrode 36. The support layer 24, oxide layer 26, top electrode 28, piezoelectric layer 34, and bottom electrode 36 collectively define the first membrane 18.

The first and second electrodes 28, 36, respectively, may comprise any suitable material. In a working embodiment, for example, the bottom electrode 36 comprises a layer of gold (Au). The first electrode 28 comprises a first layer 32 of platinum (Pt) and an optional second layer 30 of titanium (Ti) to facilitate adhesion of the platinum layer to the silicon oxide layer 26. The piezoelectric layer 34 may be made from any material having sufficient piezoelectric properties, such as lead zirconate titanate (PZT) or zinc oxide (ZnO).

The intermediate layer 38 comprises, for example, a layer of photoresist material, such as SU-8 (available from Shell Chemical Co.). An aperture is formed in the photoresist material so as to form the side walls 20 of the micro-transducer 10. The second membrane 16 of the micro-transducer 10 comprises the material of the second major layer (e.g., silicon in the present case). The second membrane 16 has a thickness greater than that of the first membrane 18, and therefore the second membrane 16 is generally more rigid than the first membrane. Consequently, the first membrane 18 flexes inwardly and outwardly while the second membrane 16 retains a substantially constant profile during operation of the micro-transducer 10.

Generally speaking, the piezoelectric layer 34 together with the electrodes 28 and 36 define a piezoelectric unit that functions as both a piezoelectric actuator (converting electrical work to mechanical work) and as a piezoelectric generator (converting mechanical work to electrical work). For operation as an actuator, a voltage applied to the top and bottom electrodes 28, 36, respectively, causes the piezoelectric layer 34, and thereby the first membrane 18, to flex inwardly, thereby compressing the vapor phase 22 of the working fluid 6. Conversely, for operation as a generator, a voltage is generated across the top and bottom electrodes, 28 and 36, respectively, whenever the vapor phase 22 of the working fluid 6 expands to cause the piezoelectric layer 34, and thereby the first membrane 18, to flex outwardly. Thus, the first membrane 18 flexes in and out, alternately expanding and compressing, respectively, the vapor phase of the working fluid contained within the transducer. Unlike sliding and rotating parts in conventional machinery, however, the micro-transducer 10 eliminates the problem of dissipative losses due to sliding friction. Further details of the operation and design of the micro-transducer 10 are described below, first with reference to a micro-heat engine and then with reference to a micro-heat pump.

Micro-Heat Engine

FIGS. 2A-2D illustrate the thermodynamic cycle of a heat engine 42 according to a one embodiment operating between a high-temperature heat source 44 and a low-temperature heat sink 46. In the illustrated embodiment, the high-temperature heat source 44 has thermal switches, or contacts, 48 operable to periodically thermally couple the first membrane 18 with the high-temperature heat source 44. Similarly, the low-temperature heat sink 46 has thermal switches, or contacts, 50 operable to periodically thermally couple the second membrane 16 with the low-temperature heat sink 46. The thermodynamic cycle of the heat engine 42, which is based on the Carnot vapor cycle, consists of the following four processes: (1) compression, (2) high-temperature heat-addition, (3) expansion and electrical power production, and (4) low-temperature heat-rejection. During this four-process cycle, the first membrane 18 of the heat engine 42 completes one full oscillation.

The first process of the cycle, compression, is represented by FIG. 2A. In the compression stroke of an initial cycle, an electrical switch (not shown) connected to the top and bottom electrodes 28 and 36 (FIG. 1A) is closed to generate a voltage across the piezoelectric layer 34 (FIG. 1A). The applied voltage causes the piezoelectric layer 34 (FIG. 1A), and thereby the first membrane 18, to flex downwardly toward the second membrane 16, thereby compressing the vapor 22. As the overall volume of the working fluid 6 decreases, the pressure of the working fluid 6 increases, which results in a corresponding increase in temperature. At the end of the compression process, the electrical switch is opened, whereby the piezoelectric layer 34 becomes a capacitor that stores any charge accumulated on the electrodes 28, 36 during the time period in which the voltage was applied.

Figure 2B:
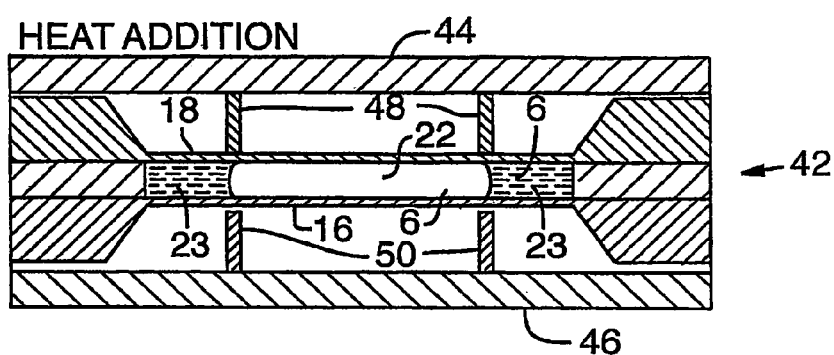

During the second process, high-temperature heat-addition, the high-temperature heat source 44 is thermally coupled to the first membrane 18 via thermal switches 48 to transfer thermal energy to the heat engine 42 through conduction (as shown in FIG. 2B). As heat moves into the working fluid 6, some of the liquid portion 23 of the working fluid 6 vaporizes, thereby increasing the overall volume the working fluid 6 and causing an upward displacement of the first membrane 18. With the upward displacement of the first membrane 18, the applied strain increases the dipole moment of piezoelectric layer 34 (FIG. 1A), which in turn causes an increase in the open-circuit voltage of the electrodes 28 and 36 (FIG. 1A). At the end of the heat-addition process, the temperature and pressure in the working fluid 6, as well as the open-circuit voltage across the electrodes 28 and 36, will have reached their respective maximum values of the working cycle.

Figure 2C:
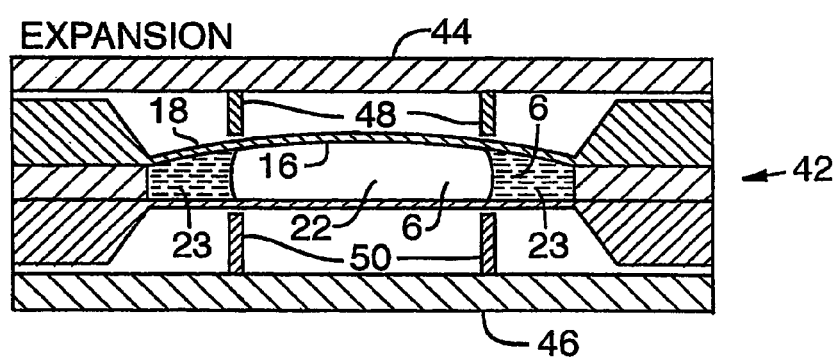

Referring to FIG. 2C, there is shown the third process, expansion and electrical power production from the coupling with heat source 44 in FIG. 2B. In this process, the previously described electrical switch (not shown) is closed to allow for the removal of the electric charge stored in the electrodes 28 and 36 (FIG. 1A). The resulting electric current flows from the electrodes to, for example, an electronic power conditioner (not shown), where the energy can be made available in a form usable by micro-electronic devices or MEMS. As charge is drained from the electrodes 28 and 36, the modulus of elasticity and the resulting strain of the piezoelectric layer 34 (FIG. 1A) decrease from a higher open-circuit value to a lower closed-circuit value. Accordingly, the piezoelectric layer 34 (FIG. 1A) relaxes, which allows the first membrane 18 to flex upwardly under the pressure of the working fluid 6. The vapor 22 of the working fluid 6 therefore expands as pressure and temperature decrease until the first membrane 18 reaches its point of greatest outward deflection, as shown in FIG. 2C.

Figure 2D:
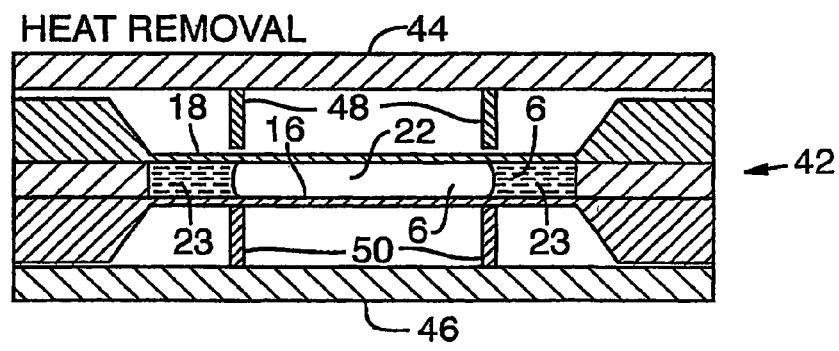

During the fourth process, low-temperature heat-rejection, the low-temperature heat sink 46 is thermally coupled to the second membrane 16 via thermal switches 50 to remove thermal energy from the heat engine 42 through conduction (as shown in FIG. 2D). As heat is removed from the heat engine 42, some of the vapor 22 condenses, which causes a decrease in the volume of the working fluid 6. Such decrease in the volume of the working fluid 6 results in a return deflection of the first membrane 18 and a corresponding decrease in strain in the piezoelectric layer 34 (FIG. 1A). Since the low-temperature heat-rejection process occurs with the electrical switch closed and no external voltage applied, the piezoelectric layer 34 is short-circuited. As a result, no charge can build up in the piezoelectric layer 34 (FIG. 1A), and the modulus of elasticity of the piezoelectric layer 34 (FIG. 1A) returns to its higher open-circuit value to assist return of the first membrane 18 to its inwardly deflected position of FIG. 2A. Following the heat-rejection process, the thermodynamic cycle then repeats itself, starting again with the compression process.

The efficiency of the mechanical-to-electrical conversion in the piezoelectric layer 34 will depend strongly upon how closely the frequency of oscillation of the first membrane 18 matches its resonant mechanical frequency. This is because only a portion (about one-tenth) of the mechanical energy transferred into the piezoelectric layer 34 as strain is converted into electrical energy (the remaining portion of mechanical energy is stored as spring energy). Thus, if the heat engine 42 is operated at or near the resonant mechanical frequency of the first membrane 18, mechanical energy not converted to electrical energy but stored as spring energy can be reclaimed later in the cycle. In particular, this stored spring energy can be used to achieve compression (process one, FIG. 2A) of the working fluid subsequent to the initial cycle. Such recovery of the strain energy will effect a substantial increase in engine efficiency since compression is accomplished without drawing current from an outside source. Conversely, operating with an oscillation frequency not equal to the resonant frequency will result in the loss of some or all of this stored spring energy, accompanied by a subsequent loss of engine efficiency.

Since thermal energy is transferred into the heat engine 42 from an external source, the heat engine 42 operates in a manner that is similar to that of a large-scale external-combustion engine. However, unlike conventional large-scale external-combustion engines, the working fluid does not circulate from the heat engine 42 to a separate heat-exchanger. Instead, heat is alternately transferred in and out of the heat engine via conduction through the second and first membranes 16, 18, while the working fluid remains inside the heat engine 42. In essence, the heat engine 42 functions as its own heat-exchanger, which is a consequence of the large surface-to-volume ratio that can be achieved on the micro-scale level. Thus, it should be apparent that the micro-heat engine 42 integrates all heat-engine functions into a self-contained cell-like structure. Such a design solution would be impossible in a large-scale engine.

Although a single heat engine 42 may be sufficient to supply the power requirements for certain applications, multiple heat engines may be connected in parallel to increase power output. For example, if one heat engine operating at a predetermined cycling frequency generates one milliwatt then ten heat engines connected in parallel and operating at the same frequency would generate ten milliwatts. It is then possible to provide a power source that is operable to generate anywhere from one milliwatt to several watts of power, or more, by varying the number of heat engines.

Figure 5:
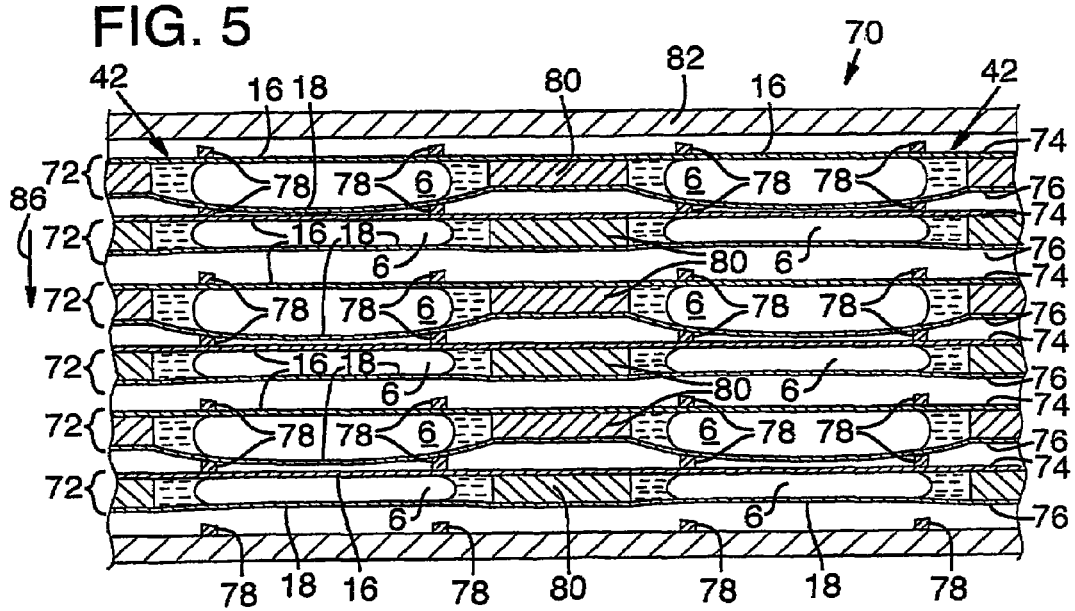
FIG. 5 is a partial, sectional view of an apparatus according to another embodiment, comprising pairs of first and second substrates stacked superposedly, with an array of identical piezoelectric micro-heat engines formed in each pair of substrates.

Referring to FIG. 5, for example, there is shown an apparatus 70 comprising pairs 72 of first and second substrates 74, 76, respectively, (e.g., pairs of silicon wafers) stacked superposedly with respect to each other so as to form a system of cascading levels, each of which operating over its own temperature differential. An array of identical heat engines 42 are micro-machined into each pair 72 of first and second substrates 74 and 76, respectively, and an intermediate layer 80 (e.g., a layer of photoresist material) is disposed between each pair of substrates. In this arrangement, each heat engine 42 is aligned with another heat engine 42 of an adjacent level, with an intervening insulating layer of air. Each heat engine 42 comprises a flexible first membrane 18 having a piezoelectric unit (i.e., a piezoelectric layer disposed between two electrodes) and a substantially rigid second membrane 16. Thermal switches or contacts 78 may be positioned on the second membranes 16 of the heat engines 42.

A high-temperature heat source 82 is positioned adjacent to the second membranes 16 of the level operating in the highest temperature range in the cascade (shown as the uppermost pair 72 of substrates 74 and 76 in FIG. 5). The high-temperature heat source 82 is operable to periodically thermally contact the adjacent second membranes 16. Thermal contacts 78 may be disposed on the high-temperature heat source 82 for contact with the adjacent second membranes 16. Similarly, a low-temperature heat sink 84 is positioned adjacent to the first membranes 18 of the level operating in the lowest temperature range (shown as the lowermost pair 72 of substrates 74 and 76 in FIG. 5). The low-temperature heat sink 84 is operable to periodically thermally contact the adjacent first membranes 18, and, like the high-temperature heat source 82, the low-temperature heat sink may include thermal contacts 78. Thus, thermal energy is conducted through the apparatus 70 in the direction indicated by arrow 86.

In FIG. 5, the apparatus 70 is operated so that the thermodynamic cycles of the heat engines 42 are synchronized. That is, each heat engine 42 in a particular level desirably undergoes the same process of the thermodynamic cycle at the same time. However, each level desirably operates 180° out of phase from the adjacent level(s). For example, whenever the heat engines 42 of one level undergo a heat-addition process, the heat engines 42 of an adjacent level undergo a heat-rejection process. Thus, the first membrane 18 of each heat engine 42 serves as the high-temperature heat source for the high-temperature heat-addition process (process two) of a heat engine 42 in an adjacent level of a lower temperature range. Similarly, the second membrane 16 of each heat engine 42 serves as the low-temperature heat sink for the low-temperature heat-rejection process (process four) of a heat engine 42 in an adjacent level of a higher temperature range. The thermal switches 78 are positioned on the second membranes 16 to facilitate conduction of thermal energy from the first membranes 18 to respective second membranes 16 in an adjacent level of a lower temperature range.

The use of a cascading arrangement is advantageous because the temperature differential of each heat engine 42 is relatively small due to the limited expansion and compression ratio that can be achieved with the piezoelectric member. Thus, by configuring a cascade of heat engines 42, it is possible to provide a power source that works over any arbitrarily large temperature range. Operating in a cascading arrangement is also desirable in that it is possible to select a working fluid 6 that is most appropriate for the pressure and temperature range of a particular level.

To ensure that there is adequate heat transfer through the heat engine 42, the dimensions of the heat engine 42 desirably, although not necessarily, provide for a low aspect ratio (i.e., a low thickness-to-width ratio) in order to maximize heat-transfer area and minimize conduction path lengths. A suitable aspect ratio that is sufficiently low can be obtained with a heat engine having first and second membranes each having a thickness of about 5 microns or less. The thickness of the engine cavity 8, i.e., the distance between the membranes 16, 18, desirably is about 50 microns or less. As such, the working fluid in the engine cavity 8 will be in the form of a thin layer. In contrast, the lengths of the membranes desirably are relatively larger than their thickness, for example, between 1 to 5 mm, although larger or smaller membranes may be used.

EXAMPLE 1

In one example of a micro-heat engine 42, the first membrane 18 has a thickness of about 2 microns, the second membrane 16 has a thickness of about 5 microns, and the thickness of the engine cavity is about 25 microns. The total length of the conduction path through the heat engine is therefore about 32 microns. The surfaces of the second and first membranes have dimensions of approximately 2.0 millimeters by 2.0 millimeters, which provides an aspect ratio of about 0.0160 and a heat-transfer area of 4.0 millimeters 2 at each membrane. It has been found that the foregoing dimensions will ensure a maximum surface-area-per-unit volume of working fluid and a conduction path sufficiently short to drive heat through the heat engine. The thicknesses of the silicon layer 24 and the silicon oxide layer 26 of the first membrane 18 are about 600 nm and 400 nm, respectively. The top electrode 18 comprises a 20-nm thick layer of Ti and a 200-nm thick layer of Pt. The piezoelectric member 34 comprises a 500-nm thick layer of PZT. The bottom electrode comprises a 200-nm thick layer of Au. The working fluid is R11.

Of course, those skilled in the art will realize that the foregoing dimensions (as well as other dimensions provided in the present specification) are given to illustrate certain aspects of the invention and not to limit them. These dimensions can be modified as needed in different applications or situations.

Micro-Heat Pump

By reversing the operating cycle of the heat engine 42 shown in FIGS. 2A-2D, the heat engine can be used as a micro-heat pump or refrigerator. Referring now to FIG. 3, there is shown a heat pump 60, having the same general construction as the micro-transducer 10 of FIG. 1, operating between a low-temperature heat source 62 and a high-temperature heat sink 64. In the illustrated embodiment, the high-temperature heat sink 64 comprises thermal switches 68 for periodically thermally coupling the second membrane 16 with the high-temperature heat sink 64. Similarly, the low-temperature heat source 62 has thermal switches 66 to periodically thermally couple the first membrane 18 with the low-temperature heat source 62.

During the working cycle of the heat pump 60, low-temperature thermal energy is transferred into the heat pump 60 from the low-temperature heat source 62 by conduction. By compressing the vapor 22 of the working fluid 6, the low-temperature thermal energy is transformed into high-temperature thermal energy, which is then transferred out of the heat pump 60 to the high-temperature heat sink 64 by conduction. According to the reverse order of the ideal Carnot vapor cycle, the thermodynamic cycle of the heat pump 60 is characterized by four processes: (1) compression, (2) high-temperature heat rejection, (3) expansion and (4) low-temperature heat absorption. As with the heat engine 42, the first membrane 18 of the heat pump 60 completes one full oscillation during the cycle.

At the beginning of the first process, compression, the volume of the heat pump cavity is at its point of greatest volume, and the first membrane 18 is at its point of maximum outward deflection. Compression is accomplished by closing an electrical switch (not shown) connected to the top and bottom electrodes 28 and 36 (FIG. 1A) to generate a voltage across the piezoelectric layer 34 (FIG. 1A). When the voltage is applied, the piezoelectric layer 34 functions as an actuator, causing the first membrane 18 to flex downwardly toward the second membrane 16 and thereby compress the vapor 22. As the overall volume of the working fluid 6 decreases, the pressure of the working fluid 6 increases, which results in a corresponding increase in temperature. At the end of the compression process, the electrical switch is opened, whereby the piezoelectric layer 34 becomes a capacitor that stores any charge accumulated on the electrodes during the time the voltage was applied.

During the second process, high-temperature heat-rejection, the high-temperature heat sink 64 is thermally coupled to second membrane 16 via thermal switches 68 to remove thermal energy from the heat pump 60 through conduction. As heat is removed from the heat pump 60, some of the vapor 22 condenses, which causes a decrease in the volume of the working fluid 6. The temperature and pressure of the working fluid 6, however, remain constant because the working fluid is a saturated mixture of liquid and vapor. The decrease in the volume of the working fluid 6 allows the first membrane 18 to flex further toward the second membrane 16. Since this process occurs with the electrical switch open, the dipole moment of the piezoelectric layer 34, and thus the open-circuit voltage of the electrodes 28 and 36, decrease as the first membrane 18 flexes inward.

The third process, expansion, begins with the working fluid 6 being compressed to its smallest possible volume and the first membrane 18 at its point of maximum inward deflection. To commence the expansion process, the electrical switch is closed to allow for the removal of the electric charge stored in the electrodes 28 and 36. As charge is drained from the electrodes 28 and 36, the modulus of elasticity and the resulting strain of the piezoelectric layer 34 decreases from a higher open-circuit value to a lower closed-circuit value. Accordingly, the piezoelectric layer 34 relaxes, which allows the first membrane 18 to flex upwardly under the pressure of the working fluid 6. The working fluid 6 thus expands as pressure and temperature decrease until the first membrane 18 reaches its neutral point, or point of zero deflection.

Unlike conventional large-scale heat pumps, e.g., vapor compression and adsorption machines, which utilize a throttling valve to expand the working fluid in an isenthalpic process, without producing any work, the micro-heat pump 60 produces work during the expansion process in the form of an electric current flowing from the electrodes 28, 36. By extracting work, the micro-heat pump 60 provides for the expansion of the working fluid 6 in a substantially isentropic process, which is significant for two reasons. First, the extraction of work in an isentropic process causes the internal energy and the temperature of the working fluid 6 to drop more than in an isenthapic throttling process. As such, more cooling will result. Second, the efficiency of the cycle can be increased if the electric current generated during the expansion is used to offset the power required to compress the working fluid 6 in the first process.

During the fourth process, low-temperature heat absorption, the low-temperature heat source 62 is thermally coupled to the first membrane 18 via thermal switches 66 to transfer thermal energy to the heat pump 60 through conduction. As heat moves into the working fluid 6, some of the liquid portion 23 of the working fluid vaporizes, thereby increasing the volume of the working fluid 6. This causes an upward displacement of the first membrane 18 and an electrical current to flow from the electrodes 28 and 36. As in the heat-rejection process (process two), the temperature and pressure remain constant because the working fluid 6 is a saturated mixture of liquid and vapor. Following the heat-absorption process, the thermodynamic cycle then repeats itself, starting again with the compression process.

As with the heat engine 42 of the present invention, the heat pump 60 integrates all heat-pump functions into a self-contained, cell-like structure. Also, similar to the system of cascading heat engines 42 of FIG. 5, multiple heat pumps 60 may be arranged in a similarly configured system of cascading levels in order to increase the rate of cooling and the temperature differential obtainable using only a single heat pump. As an example, if a single heat pump 60 cools a cold space by 10° C., then ten similar heat pumps 60 stacked in a cascade array may cool the lowermost cold space of the cascade by 100° C. In addition, if a single heat pump 60 transfers 0.1 Watt of thermal power out of a cold space, then ten heat pumps 60 deployed in parallel may transfer 1.0 Watt of thermal power out of the same cold space.

The dimensions suggested for the heat engine 42 may also be used for the heat pump 60. Again, to ensure that there is adequate heat-transfer area through the heat pump, the dimensions desirably provide for a low aspect ratio.

Fabrication Methods for the Micro-Heat Engine and Micro-Heat Pump

Figure 4:
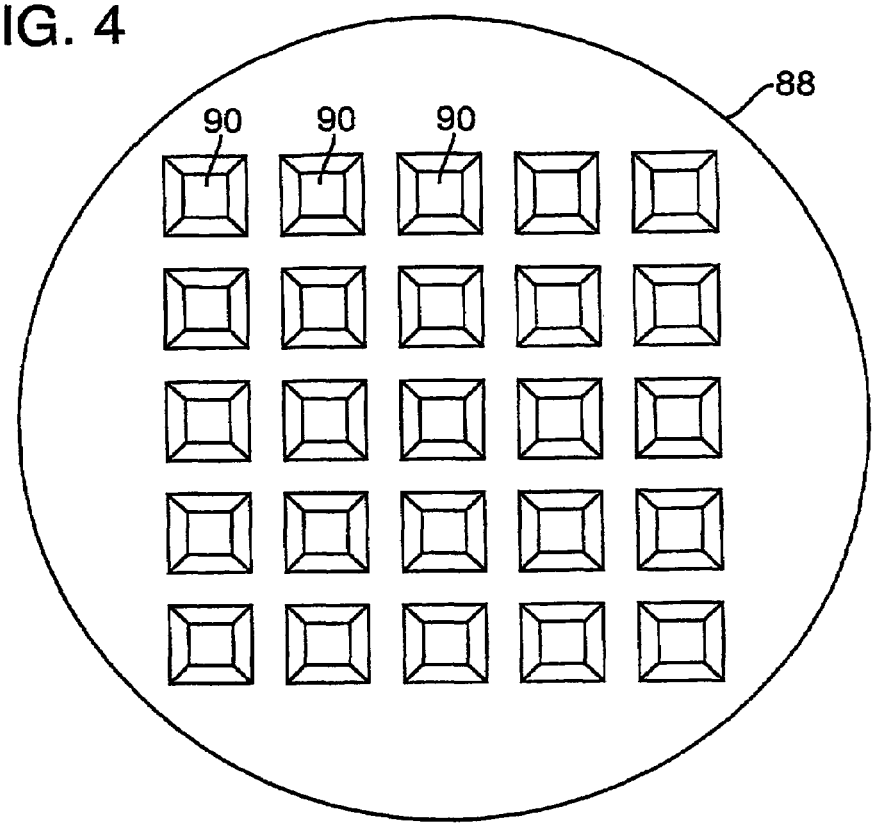
FIG. 4 is a top plan view of the backside of a first wafer of a pair of wafers used for constructing an array of piezoelectric micro-transducers, wherein the first wafer defines a plurality of square pits therein for forming the first membranes of the array of micro-transducers.

Using conventional micro-manufacturing techniques, an array of micro-transducers can be constructed from a pair of silicon wafers. Referring to FIG. 4, a first wafer 88 of a pair of silicon wafers, each being in the (001) crystal/lattice orientation and polished on both sides, is provided to form the first membranes 18 of an array of micro-transducers 10. First, thermal oxide is grown on both sides of the wafer 88. Then, a pattern of squares each oriented in the <100>direction is defined, for example, using conventional lithography on the backside of the first wafer. The oxide is then removed via wet chemical etching and the first wafer 88 is placed in an anisotropic etchant, such as ethylene diamine pyrochatecol (EDP), which preferentially removes silicon on a {001} plane compared to a {111} plane. Etching causes a plurality of pits 90 to be defined where the oxide had been removed. The first wafer 88 is removed from the etchant when approximately 50 microns of silicon remains at the bottom of each pit 90. A layer of 20-mn thick titanium is then deposited on the non-etched oxide side using physical vapor deposition, and a layer of 200-nm thick platinum is then grown over the layer of titanium using physical vapor deposition. The titanium and platinum layers will form the top electrode 28 of each transducer 10 formed in the wafers.

To form the piezoelectric layer 34 for each micro-transducer 10, a solution deposition route for PZT deposition is carried out on the first wafer 88. First, a solution containing the stoichiometric ratio of Pb, Zr, and Ti required for forming the Perovskite phase is spin-coated onto the layer of platinum. The first wafer 88 is then heated in air to 100° C. for 5 minutes and to 350° C. for 5 minutes. The spin-coating and heating processes are repeated until the PZT layer is about 500 nm thick, after which the first wafer 88 is heated in a furnace to 700° C. for 15 minutes. The steps of spin-coating and heating the wafer 88 in air to 100° C. for 5 minutes and to 350° C. for 5 minutes are repeated until the final thickness of the piezoelectric layer 34 is achieved, which desirably is about 500 nm. Once the final thickness of the piezoelectric layer 34 is achieved, the first wafer 88 is again heated in a furnace to 700° C. for 15 minutes.

To form the bottom electrodes 36 of the micro-transducers 10, a 200-nm thick layer of gold is deposited on the PZT surface via physical vapor deposition. The first wafer 88 is then placed into another anisotropic etchant in which the remaining 50 microns of silicon at the bottom of each pit 90 are removed until the desired layer thickness of silicon remains (e.g., between 1 and 10 microns).

To form the second membranes 16 of the micro-transducers 10, an array of square pits is machined on the back side of a second wafer (not shown), wherein the array on the second wafer corresponds to the array of pits 90 on the first wafer 88. Machining is continued on the second wafer until approximately 30 microns of silicon remains at the bottom of each pit To form the side walls 20 of the fluid cavities 8, a layer of photoresist material such SU-8 is spin-coated on the front side of the second wafer. The cavity thickness of each microtransducer 10, preferably about 50 microns, is defined by the thickness of the photoresist layer added to the second wafer. Photo-lithography is then used to define a pattern of squares on the photoresist material having the same foot print as the squares defining the first membranes 18 and the second membranes 16. The unmasked portions of the photoresist layer are etched to a depth of 50 microns to form the fluid cavities 8. After the cavities 8 are defined, a small amount of working fluid is added to each cavity using, e.g., a syringe dispenser. The first wafer 88 is then brought face-down into contact with the SU-8 photoresist deposited on the front side of the second wafer, with the square cavities on both wafers being in alignment with each other. Finally, the first and second wafers are secured together to form an array of identical micro-transducers. If desired, the individual transducers may be separated from the wafers for applications having power or cooling requirements that can be met using only a few transducers.

Liquid-Droplet Thermal Switch

In the embodiments of FIGS. 3, 2A-2D, and 5, the thermal switches (e.g., thermal switches 66, 68 of FIG. 1) are depicted as solid contacts. However, other types of thermal switches can be implemented to control the flow of heat into and out of the micro-transducers previously described. One such thermal switch utilizes one or more drops of liquid to conduct heat between two surfaces.

Figure 6A:
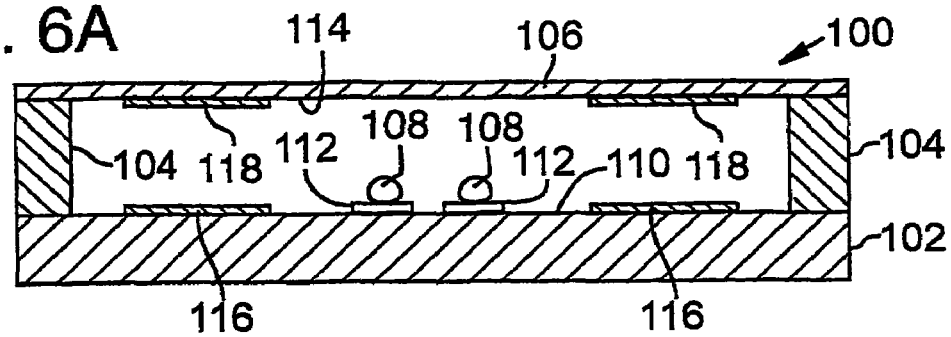
FIGS. 6A and 6B are cross-sectional views of a thermal switch, according to one embodiment, shown in a de-activated state (FIG. 6A) and an activated state (FIG. 6B).
Figure 6B:
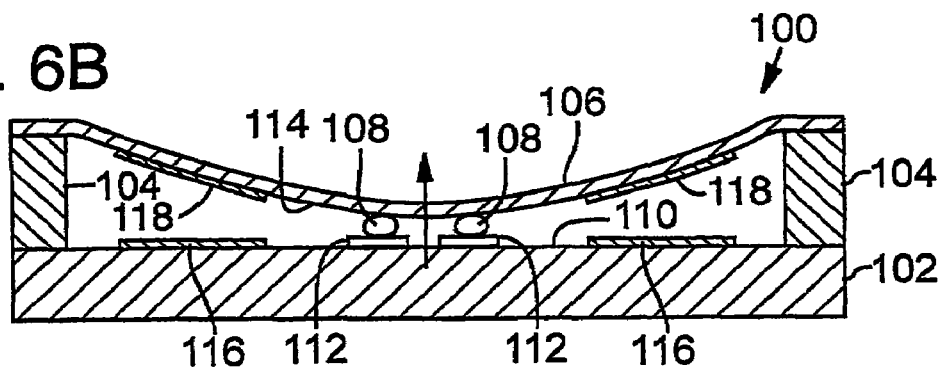

One embodiment of a liquid-droplet thermal switch is shown in FIGS. 6A and 6B. FIGS. 6A and 6B illustrate a thermal switch 100 that includes a first thermally conductive member 102, a second thermally conductive member 106, and posts, or spacers, 104 disposed between and separating the thermally conductive members 102, 104. The first thermally conductive member 102 serves as a base, or support, for carrying one or more drops 108 of a thermally conductive liquid.

In particular embodiments, the liquid drops 108 are drops of liquid metal, such as mercury, gallium, or indium, or metal alloys, such as gallium-indium alloy. As used herein, the term "metal" is used generically to refer to metals and metal alloys. Liquids other than metals which exhibit good thermal conductance also can be used.

The drops 108 may be supported on respective pads, or contacts, 112 that are also made of a thermally conductive material. The surface tension between the drops 108 and the contacts 112 retains the drops 108 on their respective contacts 112 during operation of the thermal switch.

The second thermally conductive member 106 in the illustrated embodiment is a flexible membrane (also referred to herein as a flexible member) which serves as an actuator or activation device that is selectively deflectable between a non-deflected position (shown in FIG. 6A) and a deflected position (shown in FIG. 6B). When the membrane 106 is in the deflected position (FIG. 6B), the membrane thermally contacts the liquid drops 108 to "close" the thermal switch and establish a path of low thermal resistance and high thermal conductance between the membrane and the base 102 to facilitate the flow of heat through the thermal switch. This may be referred to as the "on" or "activated" state of the thermal switch. As used herein, to bring two surfaces into "thermal contact" with each other means to bring the surfaces within sufficient proximity to each other to cause the rate of heat transfer between the surfaces to increase. "Thermal contact" may include, but is not limited to, actual physical contact between the surfaces.

When the membrane 106 is in the non-deflected position (FIG. 6A), the membrane 106 is spaced from the liquid drops 108 to "open" the thermal switch so that a path of high thermal resistance and low thermal conductance exists between the membrane 106 and the base 102. This may be referred to as the "off" or "de-activated" state of the thermal switch. The performance of the thermal switch 100 can be characterized by the ratio of the thermal resistance of the switch in the "on" position to the thermal resistance of the switch in the "off" position.

To maximize heat transfer through the thermal switch when it is in the "on" position, the membrane 106 desirably is configured to physically contact and slightly compress the drops 108, as shown in FIG. 6B. As demonstrated in the example below, increasing the force applied to the drops 108 by the membrane 108 causes an increase in the thermal conductivity of the thermal switch.

The direction of heat flow through the thermal switch 100 depends on the application in which the thermal switch is used. For example, if the base 102 is a heat source (or is coupled to a heat source) and the membrane 106 is a heat sink (or is coupled to a heat sink), then heat flows from the base 102 to the membrane 106 (as indicated by the arrow in FIG. 6B) whenever the membrane 106 is actuated to thermally contact the liquid drops 108. Conversely, if the base 102 is a heat sink (or is coupled to a heat sink) and the membrane 106 is a heat source (or is coupled to a heat source), then heat flows from the membrane to the base whenever the membrane is actuated to thermally contact the liquid drops 108.

Any of various suitable techniques can be implemented to cause deflection of the membrane 106 and activate the thermal switch 100. In the illustrated embodiment, for example, one or more electrodes 116 are mounted to the upper surface 110 of the base 102 and one or more electrodes 118 are mounted on the lower surface 114 of the membrane 106. The electrodes 116, 118 may comprise any suitable material, such as gold, platinum, or various other metals or alloys. The electrodes 116 are electrically connected to one terminal of a power source (not shown) via respective leads (not shown), and the electrodes 118 are electrically connected to the other terminal of the power source via respective leads (not shown). When a voltage is applied to the electrodes 116, 118, an electrostatic force is generated that causes the membrane 106 to deflect inwardly toward the base 102 (FIG. 6B). Removing the voltage causes the membrane 106 to return to its non-deflected position (FIG. 6A). In this manner, the membrane 106 functions as an electrostatic transducer.

In another embodiment, the membrane 106 is a piezoelectric transducer comprising a piezoelectric member interposed between two electrodes, much like the first membrane 18 of the micro-transducer 10 depicted in FIG. 1. Such a piezoelectric transducer deflects inwardly toward the drops 108 upon application of a voltage to the electrodes. In still other embodiments, the membrane 106 can be an electromechanical transducer, a magnetic transducer, a magnetostrictive transducer, a capacitive transducer, or an equivalent device that can be deflected toward and away from the drops 108 upon application and removal of a stimulus.

In certain embodiments, the space between the membrane 106 and the base 102 is a fluid-tight cavity that contains an insulating gas having a low thermal conductivity (e.g., argon). The gas increases the thermal resistance of the thermal switch whenever the switch is in the "off" position.

Conventional micro-manufacturing techniques can be used to fabricate one or more identical thermal switches 100. One embodiment for forming thermal switches is as follows. First, a 100-nm layer of silicon dioxide is formed on both sides of a silicon wafer using a wet oxidation process. A 5-nm layer of titanium/tungsten and a 325-nm layer of gold are then sputtered on both sides of the wafer. Using conventional photolithography, a pattern of 10 mm×18 mm rectangular dies is formed on the front surface of the wafer, and a grid of 30-μm gold contacts 112 is formed at the center of each die. In addition, a pattern of interwoven 30-Ω resistance heaters and resistance-based temperature detectors (RTDs) is formed on the back surface of the wafer such that a resistance heater and an RTD is located opposite a respective grid of gold contacts. After developing the photoresist on both sides of the wafer, the gold and titanium layers are chemically etched from the unprotected regions of the wafer surfaces so that only the contacts, the RTDs, and the heaters remain on the wafer surfaces. The wafer is then diced into individual die to form bases 102.

Figure 14:
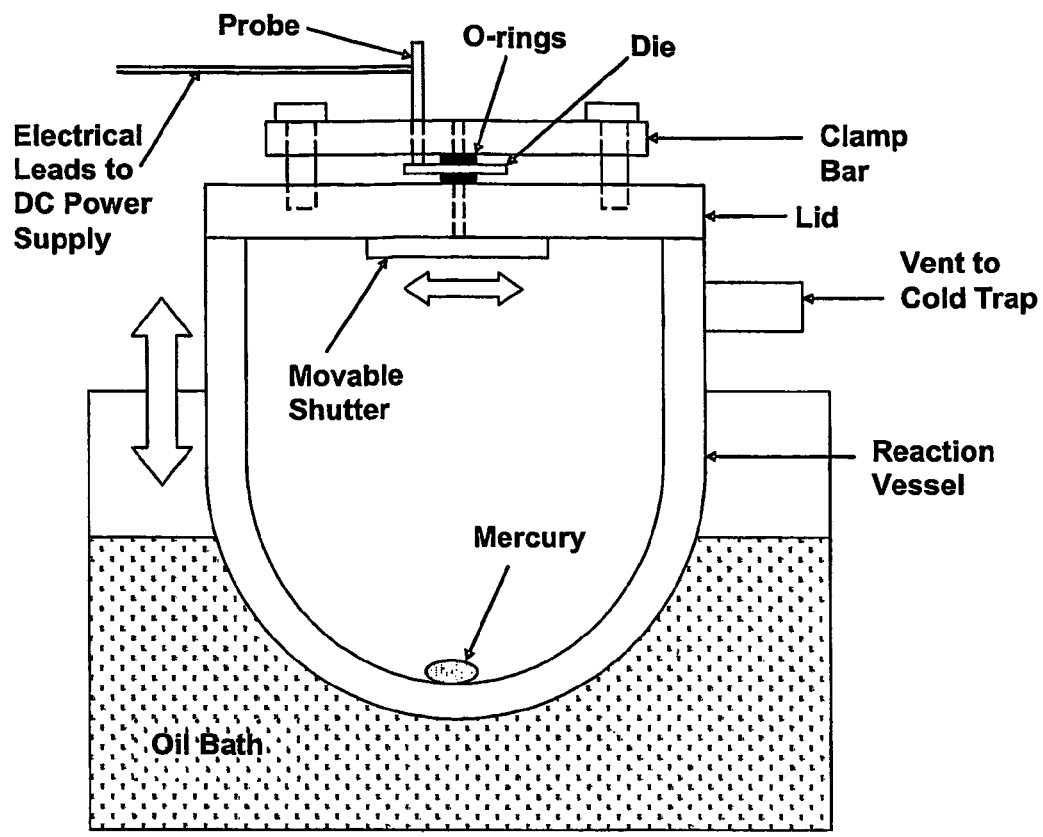
FIG. 14 is a schematic illustration of a deposition chamber used to form mercury droplets usable in various thermal switch embodiments.

A deposition chamber can be used to form drops 108 on the contacts 112 of each die. FIG. 14 schematically illustrates one example of a deposition chamber that can be used to form the drops 108. The illustrated deposition chamber comprises a 500-mL glass reaction vessel and a PTFE lid, which are sealed together with a jar clamp. The heat-conducting liquid for forming the drops (in this case mercury) is placed in the vessel. The vessel is placed in an oil bath to vaporize the mercury. A die is positioned face down over a 3-mm diameter hole formed in the lid so that the contacts 112 are exposed to mercury vapor via the hole. A clamping bar secures the die to the lid and an o-ring seals the die to the top of the lid. The exposure of mercury to the die is controlled by a movable glass slide, which can be actuated magnetically. Gold probes are electrically connected to a DC power supply and the resistance heater on the back surface of the die. A hot plate (not shown) is used to heat the oil bath, which evaporates the mercury. A vent in the vessel, which is in communication with a cold trap, prevents over-pressurization in the vessel.

To perform mercury deposition, and according to one specific approach, the power supply is set to provide a constant voltage of about 3.3 V and a current of about 0.11 A to the resistance heater to achieve a surface temperature of about 50° C. on the die. The temperature of the oil bath, which is maintained at about 180° C., is increased until the vapor pressure of the mercury in the vessel is increased to about 1.5 kPa. After heating the vessel for about 30 minutes, the slide is opened to expose the gold contacts on the die to mercury vapor. The mercury vapor chemically reacts with the gold contacts, which results in preferential condensation of liquid droplets on the contacts. The total exposure time of the contacts to the mercury vapor governs the size of the droplets. For example, exposing the contacts to mercury vapor for about 3 hours will form droplets that are approximately 30 μm in diameter. The deposition process is completed by closing the slide and heating the die with the power supply for an additional 15 minutes to allow mercury trapped in the hole in the lid to deposit on the contacts.

Plural membranes 106 having spacers 104 can be fabricated from another silicon wafer using conventional techniques. The spacers 104 can be formed by applying a layer of photoresist, PMMA (polymethyl methacrylate), or equivalent material on the wafer and then selectively etching the material in the desired shape and size of the spacers. The wafer is diced into individual membranes having spacers, which are then secured to respective dies to form a batch of thermal switches.

In another embodiment, a thermal switch can have the same configuration as the thermal switch 100 shown in FIGS. 6A and 6B, except that the drops 108 are eliminated. In such an embodiment, the membrane 106 contacts the contacts 112 (or the upper surface 110 of the base 102 if contacts 112 are not provided) whenever the switch is activated.

Figure 7A:
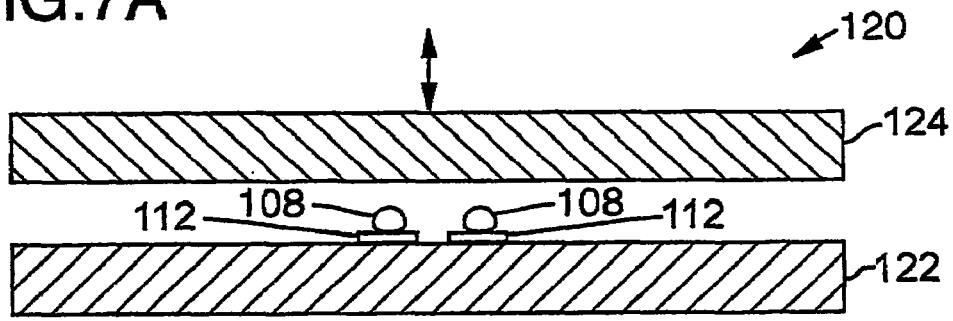
FIGS. 7A and 7B are cross-sectional views of a thermal switch, according to another embodiment, shown in a de-activated state (FIG. 7A) and an activated state (FIG. 7B).
Figure 7B:
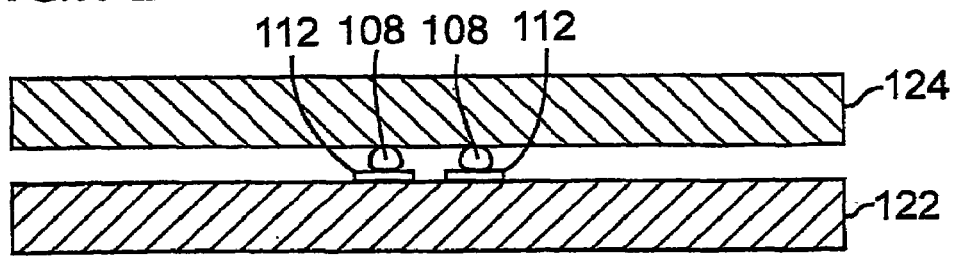

FIGS. 7A and 7B show a thermal switch 120 according to another embodiment. The thermal switch 120 includes first and second thermally conductive members 122 and 124, respectively, positioned in a juxtaposed relationship relative to each other. One or more liquid drops 108 are carried by the first thermally conductive member 122 and positioned for thermally contacting the second thermally conductive member 124. Each drop 108 may be supported on a respective contact 112.

FIG. 7A shows the thermal switch 120 in the "off" position, in which a path of high thermal resistance exists between the thermally conductive members 122, 124. To activate the thermal switch 120, the spacing between the thermally conductive members 122, 124 is decreased to establish a path of low thermal resistance between the thermally conductive members. Desirably, the second thermally conductive member 124 physically contacts the drops 108 whenever the thermal switch is activated, as shown in FIG. 7B.

The spacing between the thermally conductive members 122, 124 can be varied by moving one or both of the thermally conductive members toward and away from each other.

Movement of one or both of the thermally conductive members 122, 124 can be accomplished in any suitable manner. In one implementation, for example, one or both of the thermally conductive members can be coupled to the piston of a respective solenoid or equivalent device.

A specific application of a thermal switch having one or more thermally conductive liquid droplets is shown in FIG. 8. FIG. 8 shows an apparatus, indicated at 130, that is similar in construction to the apparatus 70 shown in FIG. 5. Thus, components in FIG. 8 that are identical to corresponding components in FIG. 5 have the same respective reference numerals.

As shown in FIG. 8, the apparatus 130 comprises pairs 72 of first and second substrates 74, 76, respectively, (e.g., pairs of silicon wafers) stacked superposedly with respect to each other so as to form a system of cascading levels 140a, 140b, 140c, 140d, 140e, and 140f. Each level 140a-140f operates over its own respective temperature differential. An array of identical heat engines 42 is formed from the first and second substrates 74 and 76, respectively, in each level 140a-140f (although only one heat engine of each level is shown in FIG. 8). A high-temperature heat source 82 is positioned adjacent to the heat engines 42 of level 140a, and a low-temperature heat sink 84 is positioned adjacent to the heat engines 42 of level 140f. Thus, level 140a operates in the highest temperature range of the cascade, and level 140f operates in the lowest temperature range of the cascade.

Thermal switches comprising one or more thermally conductive liquid droplets 132 are disposed on the second membranes 16 of the heat engines 42 and on the low-temperature heat sink 84. Each liquid droplet 132 can be disposed on a respective pad or contact 134. In particular embodiments, the droplets 132 have a diameter of about 10 to 1000 microns, with 30 microns being a specific example, although larger or smaller droplets can be used depending on the application. The liquid droplets 132 control the flow of heat into and away from each heat engine 42 by facilitating the transfer of heat into a heat engine during the heat-addition process and by facilitating the transfer of heat out of a heat engine during the heat-rejection process.

Apparatus 130 can be operated in the same manner as apparatus 70 of FIG. 5. In one implementation, for example, the apparatus 130 is operated such that each heat engine 42 of a particular level undergoes the same portion of the thermodynamic cycle at the same time, but 180° out of phase from an adjacent level. In addition, the high-temperature heat source 82 is operated periodically to contact the droplets 132 supported on the heat engines 42 of level 140a in a thermal manner.

More specifically, and referring to FIG. 8, the heat engines 42 of levels 140a, 140c, and 140e are shown as completing the expansion process and beginning the heat-rejection process, while the heat engines 42 of levels 140b, 140d, and 140f are shown as completing the compression process and beginning the heat-addition process. As shown, the membranes 18 of the heat engines in levels 140a, 140c, and 140e are flexed outwardly and contact the droplets 132 supported on the heat engines of levels 140b, 140d, and 140f. This causes heat to be rejected by the heat engines of levels 140a, 140c, and 140e and absorbed by the heat engines of levels 140b, 140d, and 140f. In addition, heat does not flow into the heat engines of level 140a at this stage of the thermodynamic cycle since the heat source 82 is not in thermal contact with the droplets 132 supported on the heat engines of level 140a.

As the thermodynamic cycle continues, the membranes 18 of the heat engines in levels 140b, 140d, and 140f flex outwardly and contact the droplets 132 supported on the heat engines of levels 140c, 140e, and the heat sink 84, and the heat source 82 contacts the droplets 132 supported on the heat engines of level 140a. This causes heat to flow into the heat engines of levels 140a, 140c, and 140e, and heat to be rejected by the heat engines of levels 140b, 140d, and 140f.

Figure 9A:
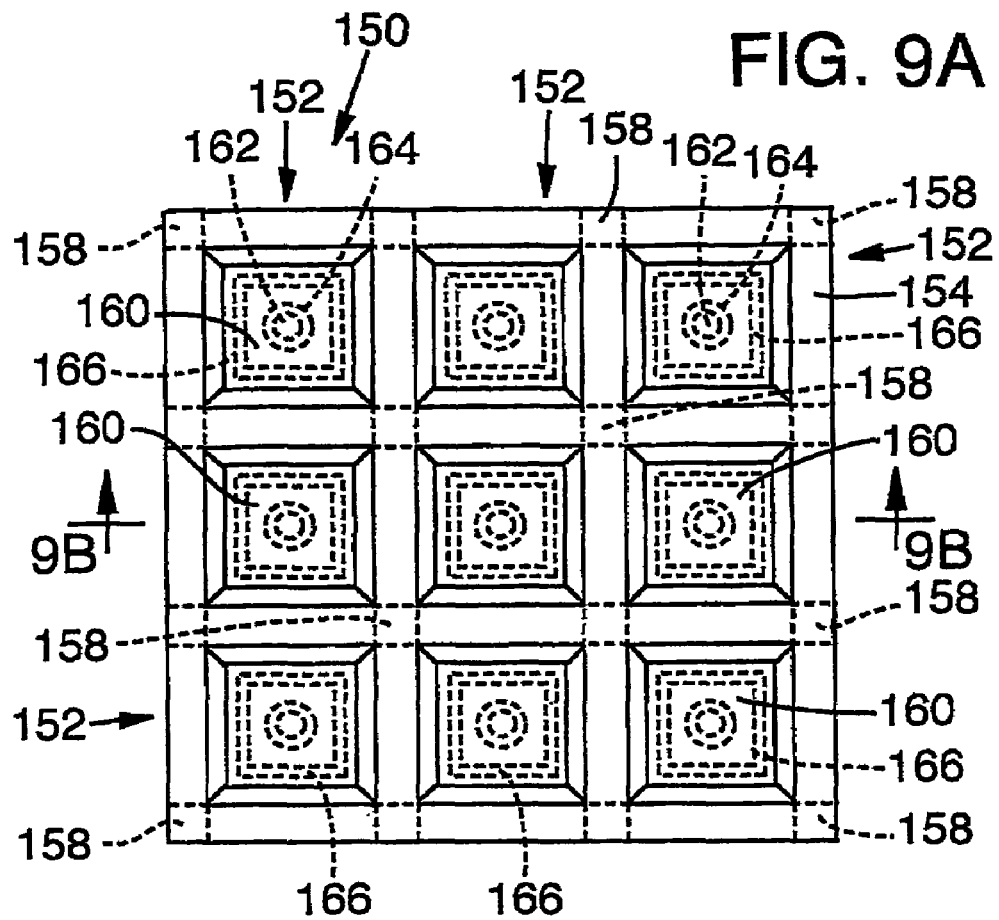
FIG. 9A is a top plan view of a thermal switch assembly, according to one embodiment, that includes an array of independently actuatable thermal switch elements.
Figure 9B:
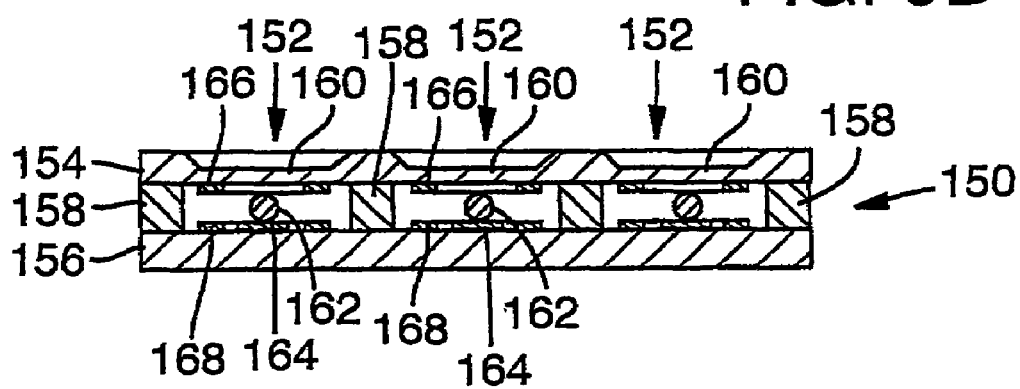
FIG. 9B is a cross-sectional view of the thermal switch assembly of FIG. 9A taken along line 9B-9B.

Referring to FIGS. 9A and 9B, there is shown an embodiment of thermal switch assembly 150 comprising a 3×3 array of independently operable thermal switches 152. As best shown in FIG. 9B, the thermal switches 152 are formed from a first substrate 154 and a second substrate 156 maintained in a spaced relationship relative to each other by spacers 158. The first substrate 154 is formed with a 3×3 array of recessed portions 160, which serve as flexible membranes for the thermal switches 152. Each thermal switch 152 has at least one thermally conductive liquid droplet 162 disposed on the second substrate and positioned to thermally contact a respective membrane 160. As shown, each droplet 162 can be disposed on a respective contact 164. As shown in FIG. 9A, each droplet 162 desirably is centrally disposed in its respective thermal switch 152 to maximize contact between the membranes 160 and the droplets 162 whenever individual switches are activated.

Each membrane 160 functions as an actuator that is selectively deflectable between a non-deflected position (shown in FIG. 9B) and a deflected position (not shown in the drawings) to thermally contact a respective liquid droplet 162. Any suitable techniques can be implemented to cause deflection of the membranes. In the illustrated embodiment, for example, each thermal switch 152 has at least one electrode 166 mounted on its respective membrane 160 and at least one electrode 168 mounted on the substrate 156. The electrodes 166 are electrically connected to one of the terminals of a power source (not shown) via respective leads (not shown), and the electrodes 168 are electrically connected to the opposite terminal of the power source via respective leads (not shown). When a voltage is applied to the electrodes 166, 168 of a thermal switch 152, the generated electrostatic charge causes its membrane 160 to deflect inwardly and contact the droplet 162. In alternative embodiments, the membranes 160 can be any of various transducers that are operable to deflect upon application of a stimulus (e.g., an applied voltage).

In addition, the membranes 160 can be activated independently of the each other to allow for selective activation of the thermal switches 152. A thermal switch 152 that is activated or turned "on" establishes a path of high thermal conductance between the first and second substrates 154, 156 at that portion of the assembly. Conversely, a path of low thermal conductance exists at each thermal switch 152 is that is "off". By selectively activating and de-activating individual thermal switches 152, the thermal conductivity of the assembly 150 can be varied spatially and temporally. In this regard, the assembly 150 exhibits a "digital" thermal conductivity that can be controlled by the selective activation of individual thermal switches 152.

Although the illustrated embodiment comprises a 3×3 array of thermal switches, it will be appreciated that the assembly can be modified as desired to include any number of thermal switches. In addition, each thermal switch 152 has a generally rectangular shape, although in other embodiments they can be circular or any of various other shapes. The substrates 154, 156 can comprise any of various suitable materials, such as silicon, quartz, sapphire, ceramic, or any of various metals or alloys.

In one specific application, the assembly 150 can be used to control the removal of heat from integrated circuits on a substrate. For example, the assembly 150 can be coupled to the substrate so that each thermal switch 152 is registered with a respective integrated circuit. In use, each thermal switch 152 is normally in the "off" position (i.e., the membranes 160 are not in thermal contact with droplets 162) so that substantially no heat is removed from any of the integrated circuits. When the temperature of an integrated circuit exceeds a predetermined threshold, the corresponding thermal switch 152 is activated to allow heat to be removed from the integrated circuit through the activated thermal switch. After the temperature of the integrated circuit drops below an acceptable level, the thermal switch is de-activated to avoid unnecessary further cooling of the circuit.

In another application, the assembly 150 can be used to control the flow of heat from a heat source into a device, such as the apparatus 130 shown in FIG. 8. For example, the assembly 150 can be positioned between the heat source 82 and the adjacent level of heat engines 42 so that each thermal switch 152 is registered with a corresponding heat engine 42. Thus, in this embodiment, the assembly 152 essentially replaces the droplets 132 and corresponding contacts 134 supported on the uppermost level of heat engines. In use, the thermal switches 152 are operated to control the flow of heat from the heat source into the stacks of heat engines. If a thermal switch is activated, then heat is allowed to flow from the heat source 82 to the uppermost heat engine of the corresponding stack of heat engines, which converts the heat energy into electrical energy as previously described.

In an alternative embodiment, a thermal switch assembly has a construction that is similar to the construction of assembly 150, except that each thermal switch defines a fluid-tight cavity between the first and second substrates 154, 156, respectively. The fluid-tight cavities can be formed by positioning between the first and second substrates an intermediate layer of material having an array of apertures that define the side walls of the cavities. The cavities can contain an insulating gas having a low thermal conductivity (e.g., argon) to increase the thermal resistance of the switches whenever they are de-activated.

The assembly 150 can be made using conventional micromanufacturing techniques. In one embodiment for making the assembly 150, for example, the first and second substrates 154, 156 are formed from first and second silicon wafers.

The first substrate 154 is prepared by forming an oxide layer on both sides of the first wafer. Using conventional photolithography, a 3×3 array is patterned on the back surface of the first wafer (the surface facing upwardly in FIG. 9B). The first wafer is then placed in an anisotropic etchant until a 3×3 array of 2-μm thick boron-doped membranes are formed. Conventional photolithography is then used to pattern a 3×3 array of gold electrodes 166 and corresponding leads on the front surface of the first wafer (the surface facing downwardly in FIG. 9B). A layer of 10-μm thick PMMA (polymethyl methacrylate) or equivalent material is spun onto the front surface of the first wafer then selectively etched to form a 4×4 array of 100-μm spacers 158.

The second substrate 156 is prepared by forming an oxide layer on both sides of the second wafer. Using conventional photolithography, a 3×3 array of gold electrodes and corresponding leads are formed on the front surface of the second wafer (the surface facing downwardly in FIG. 9B). A 3×3 array of gold contacts 164 and 30-μm diameter mercury droplets 162 are formed on the back surface of the second wafer in accordance with the process discussed above in connection with the embodiment of FIGS. 6A and 6B. The back surface of the second wafer is then secured to the spacers 158 formed on the front surface of the first wafer to form the assembly shown in FIGS. 9A and 9B.

Thermoelectric Cooler

Referring now to FIG. 10, there is shown an improved thermoelectric cooler 200 that incorporates the thermal switch assembly 150 of FIGS. 9A and 9B. The thermoelectric cooler 200 includes a thermoelectric element 202, which may comprise an N-type thermoelectric element and a P-type thermoelectric element, as known in the art. A low-temperature heat source 204 is cooled and a high-temperature heat sink 206 is heated by the thermoelectric element 202. In the illustrated embodiment, one end of the thermoelectric element 202 is continuously thermally coupled to the heat sink 206 through a path of low thermal resistance. The opposite end of the thermoelectric element 202 is thermally coupled to the heat source 204 through the thermal switch assembly 150, which can include any number of thermal switches 152. In other embodiments, the thermal switch assembly 150 can be replaced with other thermal switch configurations disclosed herein (e.g., the thermal switch 120 of FIGS. 7A and 7B).

In use, the thermal switches 152 are activated to establish a path of low thermal resistance between the heat source 204 and the thermoelectric element 202. A power source (not shown) provides a voltage across the thermoelectric element 202 to produce an electric current, as known in the art. During the flow of current, the thermoelectric element 202 absorbs heat from the heat source 204 and rejects heat to the heat sink 206. This phenomenon is known as the Peltier effect. The net cooling caused by the Peltier effect is offset by Joule heating caused by the electrical resistance of the thermoelectric element 202.

To minimize the effects of Joule heating, and therefore to increase the efficiency of the thermoelectric cooler 202, a current pulse is applied to the thermoelectric element 202.

The power supply can be used to create the pulsed current, or alternatively, an electrical switch can be placed in series with the power source to provide a pulsed current. Each current pulse causes instantaneous cooling of the heat source 204 and heating of the heat source 204. Immediately after each current pulse, the thermal switch assembly 150 is opened by deactivating the switches 152 to prevent heat from Joule heating from being transferred to the heat source 204. After the thermal switch assembly 150 is opened, any residual thermal energy in the thermoelectric element 202 due to Joule heating flows to the heat sink 206. When the temperature of the thermoelectric element 202 drops to an acceptable level, the thermal switch assembly 150 is closed by activating the switches 152 and another current pulse is supplied to the thermoelectric element 202. This process is repeated until further cooling is not required.

Thermal Cycler

Referring now to FIG. 11, there is shown an improved thermal cycler 300 that can be used for heating and/or cooling biological or chemical samples in laboratory analysis. For example, in DNA-amplification methods, such as PCR (polymerase chain reaction) and NASBA (nucleic acid sequence based amplification), thermal cyclers are used for cyclicly heating and cooling DNA samples.

The illustrated thermal cycler 300 includes a tube support 302 that is configured to support one or more tubes or containers (commonly referred to as Eppendorf® tubes or microtubes) containing a biological or chemical sample (e.g., a DNA sample) to be processed by the thermal cycler. The tube support 302 can be, for example, a block or plate having an array of wells or openings (e.g., a 12×8 array) dimensioned to receive respective tubes, as known in the art. Each tube of the tube support 302 is thermally coupled to a heat source 304 through a thermal switch assembly 150 and to a cold source 306 through a thermal switch assembly 150'. In lieu of thermal switch assemblies 150, 150', the thermal cycler may incorporate other thermal switch configurations disclosed herein to thermally couple the heat source 304 and the cold source 306 to the tubes.

The thermal switch assemblies 150, 150' control the flow of heat and cold to the tubes during operation of the thermal cycler 300. For example, to heat the samples contained in the tubes, the thermal switches 152 of the thermal switch assembly 150 are closed and the thermal switches 152' of the thermal switch assembly 150' are opened. This allows heat to be transferred from the heat source 304 to the samples contained in the tubes. To cool the samples contained in the micro-tubes, the thermal switches 152 of the thermal switch assembly 150 are opened and the thermal switches 152' of the thermal switch assembly 150' are closed to allow heat to flow from the samples to the cold source 306.

In particular embodiments, the thermal switch assemblies 150, 150' can have respective arrays of thermal switches 152, 152' that correspond to the array of micro-tubes of the tube support 302. Each thermal switch 152 is operable to couple a respective tube thermally to the heat source 304, and each thermal switch 152' is operable to couple a respective tube thermally to the cold source 306. Since the thermal switches 152, 152' can be actuated independently of each other, the temperature of individual tubes can be independently controlled. Advantageously, the process parameters (e.g., start time and temperature pattern) for each tube can be varied. For example, if multiple tubes (e.g., 96 tubes) are to be processed using the thermal cycler 300, it is not necessary to delay processing until the sample in each and every tube has been prepared for processing by the thermal cycler.

EXAMPLE 2

In this example, the performance of two mercury-droplet thermal switches is illustrated. One thermal switch comprised a 10 mm×18 mm silicon die having a 20×20 array of 30-μm mercury droplets (referred to as the 400-droplet thermal switch). Another silicon die without droplets formed the opposite side of the thermal switch. The other thermal switch comprised a 10 mm×18 mm silicon die having a 40×40 array of 30-μm mercury droplets and another silicon die without droplets (referred to as the 1600-droplet thermal switch). The silicon dies were formed using the fabrication techniques previously described.

Figure 15:
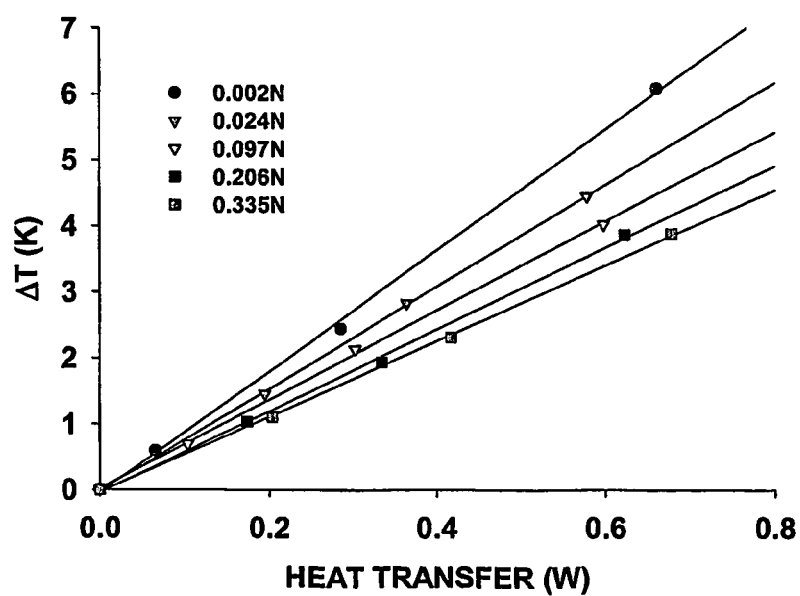
FIG. 15 is a graph showing the steady-state heat transfer across a 400-droplet thermal switch under different applied loads.
Figure 16:
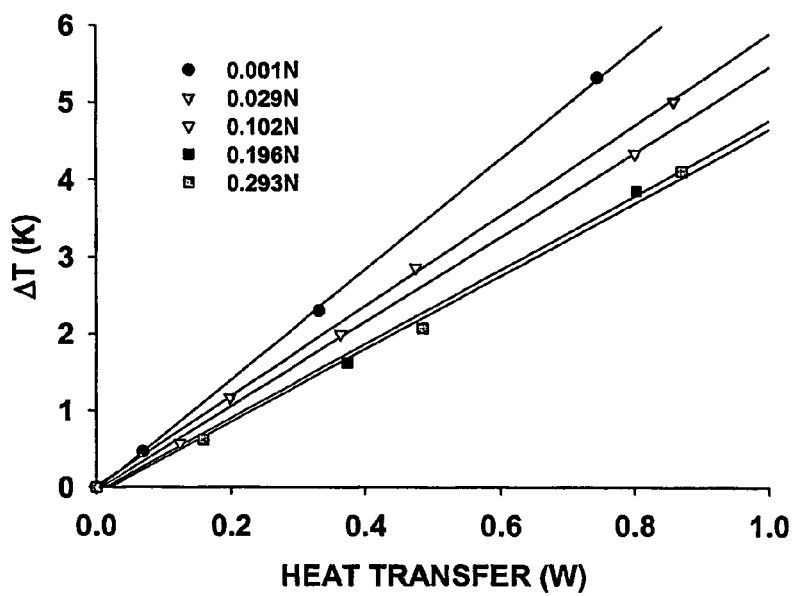
FIG. 16 is a graph showing the steady-state heat transfer across a 1600-droplet thermal switch under different applied loads.

FIG. 15 shows the steady-state heat transfer across the 400-droplet thermal switch under different applied loads (i.e., the force compressing the droplets between the two silicon dies). In FIG. 15, the temperature difference across the switch is plotted against the heat transferred across the array of droplets. Each line corresponds to a different load applied to the thermal switch. The slopes of the lines are equivalent to the thermal resistances of the thermal switch. As shown, as the compressive load on the thermal switch increases, the thermal resistance across the thermal switch decreases, thereby increasing the rate at which heat can be transferred across the thermal switch. FIG. 16 shows a similar plot for the 1600-droplet thermal switch.

Figure 17:
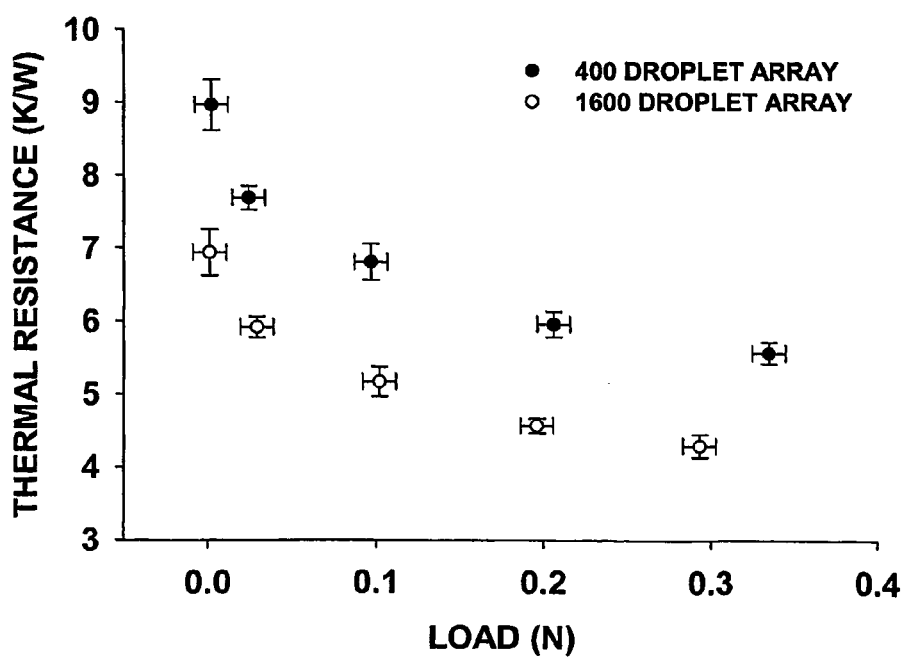
FIG. 17 is a graph showing the thermal resistance of a 400-droplet thermal switch and a 1600-droplet thermal switch under different applied loads.

The dependence of the thermal resistance of each thermal switch on applied load is illustrated in FIG. 17. The thermal resistance at each load is the average thermal resistance of the data points that lie on the line in either FIG. 15 or FIG. 16 corresponding to the load. As shown in FIG. 17, the thermal resistance of the 400-droplet switch falls from 9 K/W to 6 K/W as the load increases from 0 to 0.34 N. The thermal resistance of the 1600-droplet switch falls from 7 K/W to 4.5 K/W as the load increases from 0 to 0.29 N. The thermal resistance of each switch changes by a factor of about 1.5 as the droplets undergo deformation from no load to a load of about 0.4 N. The same relative change in thermal resistance is seen for both array sizes. The 400-droplet switch has a higher thermal resistance than the 1600-droplet switch. This higher resistance is likely the result of fewer mercury conduction paths across the switch.

Figure 18:
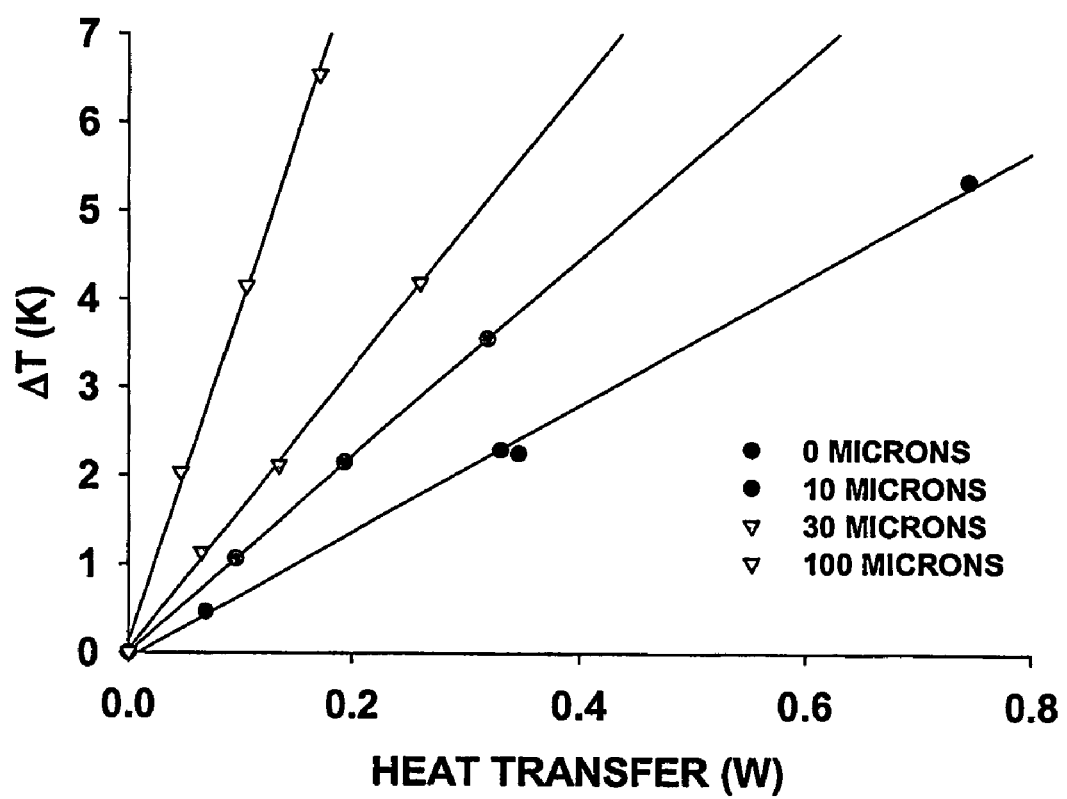
FIG. 18 is a graph showing the heat transfer across a 1600-droplet thermal switch for different air-gap distances between the droplets and one side of the switch.
Figure 19:
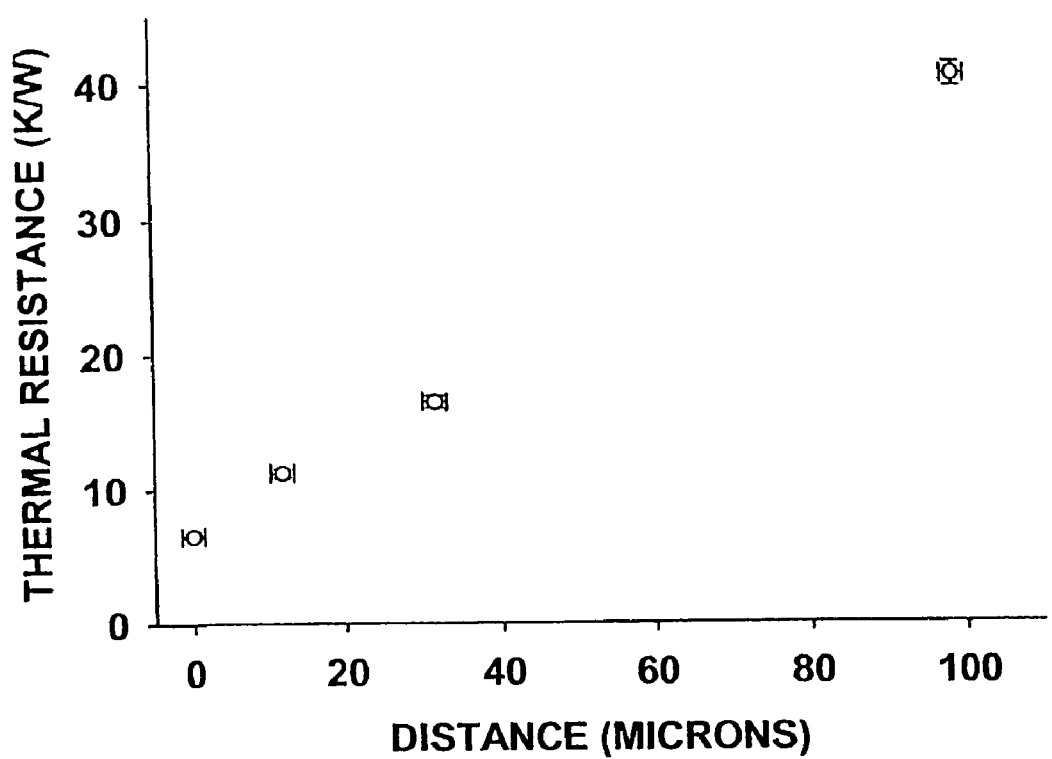
FIG. 19 is a plot of the average thermal resistances for the air-gap distances shown in FIG. 18.

FIG. 18 shows the heat transfer across the 1600-droplet switch for different air-gap distances between the droplets and the silicon die without droplets. As shown in FIG. 18, the thermal resistance of the switch increases as the spacing between the die and the droplets is increased. FIG. 19 is a plot of the average thermal resistances for the air-gap distances shown in FIG. 18. The plot of FIG. 19 indicates that the thermal resistance of the switch increases linearly as the spacing is increased.

The change in thermal resistance between "on" and "off" states of the 1600-droplet switch can be determined by comparing FIGS. 17 and 19. For example, as indicated in FIG. 17, the thermal resistance of the thermal switch when the droplets are fully deformed (corresponding to the 0.3-N load) is about 4.5 K/W. As indicated in FIG. 19, the thermal resistance of the thermal switch having a 100-micron spacing between the droplets and the heater die is about 40 K/W. Thus, operating the switch between these two positions causes the thermal resistance of the switch to increase or decrease by about a factor of nine whenever the switch is opened or closed, respectively.

"Heat-Pipe" Thermal Switch

Figure 12A:
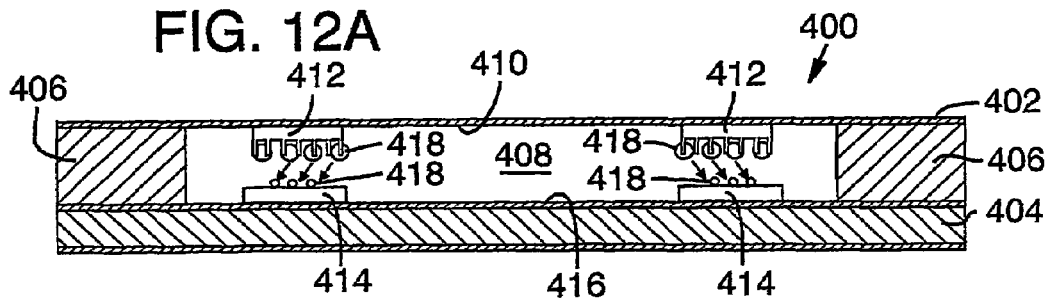
FIGS. 12A and 12B are cross-sectional views of another embodiment of a thermal switch shown in different stages of operation.
Figure 12B:
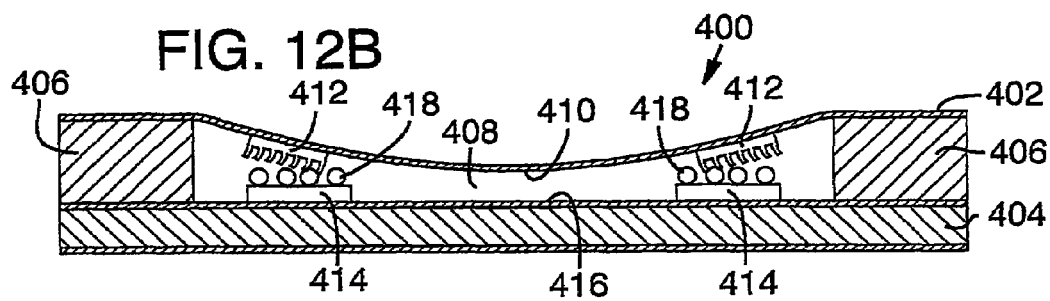

Referring to FIGS. 12A and 12B, there is shown a thermal switch 400, according to another embodiment, that functions in a manner similar to a conventional heat pipe. The thermal switch 400 in this embodiment comprises a flexible membrane or member 402, a base 404 (which can be flexible or non-flexible), and a continuous wall 406 extending along the peripheral portions of the membrane 402 and the base 404 so as to define a fluid-tight cavity 408. The membrane 402 and the base 404 desirably are made of a material exhibiting good thermal conductivity.

The membrane 402 is operable to deflect between a non-deflected position (FIG. 12A) and a deflected position (FIG. 12B). The membrane 402 can be any of various transducers that deflect in response to an applied stimulus, as discussed above. Mounted to the inner surface 410 of the membrane 402 are one or more wicks 412 that are desirably made from a hydrophilic material, such as a photoresist material or an electroplated metal.

Heat-transfer contacts 414 can be mounted to the inner surface 416 of the base 404 opposite the wicks 412. The heat-transfer contacts 414 desirably are made from a hydrophobic material, such as a self-assembled monolayer (SAM) of material.

Each of the wicks 412 can be a grooved structure formed on the inner surface 410 of the membrane 404. In one embodiment, for example, each wick 412 comprises a series of concentric grooves etched into a layer of material (e.g., photoresist) formed on the inner surface 410 of the membrane 402.

A working fluid 418 contained in the cavity 408 transports heat from the membrane 402 to the base 404 via the latent heat of the fluid, in a manner similar to the working fluid of a conventional heat pipe. The working fluid 418 can be any of various fluids commonly used in conventional heat pipes. For example, in relatively low-temperature applications (i.e., less than 200° F.), refrigerants such as R11 can be used. In moderate-temperature applications (i.e., above 200° F.), water may be used as the working fluid.

During operation, heat is transferred away from the membrane 402 by the evaporation of the liquid component of the working fluid 418 suspended on the wicks 412. The temperature difference between the membrane 402 and the base 404 creates a vapor pressure difference in the cavity 408, which forces the hot vapor to flow toward the heat-transfer contacts 414 where the vapor condenses (as indicated by the arrows in FIG. 12A). While condensing, heat contained in the vapor passes to the base 404. A heat sink (not shown) can be placed is thermal contact with the base 404 to conduct heat away from the thermal switch 400. Heat transfer between the membrane 402 and the base 404 ceases when all of the liquid suspended on the wicks 412 has evaporated, at which time the thermal switch 400 turns "off".

After a predetermined time period, the membrane 402 is activated to deflect inwardly toward the base 404 (FIG. 12B) to cause the wicks 412 to contact the liquid that has condensed on the heat-transfer contacts 414. Surface tension causes the liquid to adhere to the wicks 412. The membrane 410 is then allowed to return to its non-deflected position, which carries the liquid away from the heat-transfer contacts 414 on the base 404. This cycle is then repeated to continue the transfer of heat from the membrane 402 to the base 404.

Figure 13A:
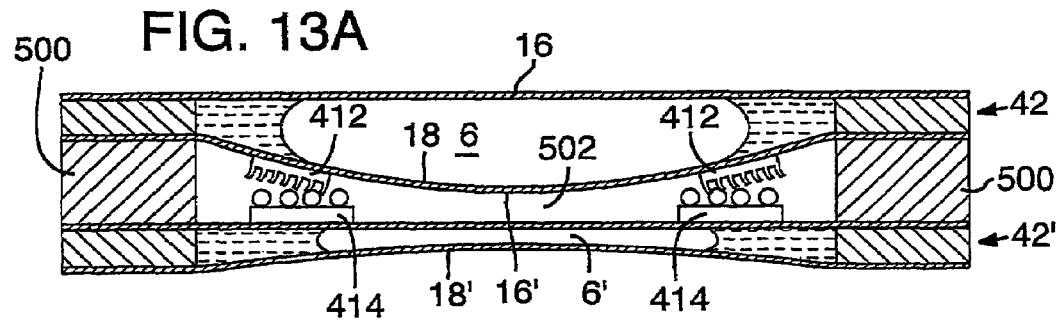
FIGS. 13A and 13B are cross-sectional views showing two micro-heat engines stacked in a cascade configuration, in which a thermal switch similar to that shown
Figure 13B:
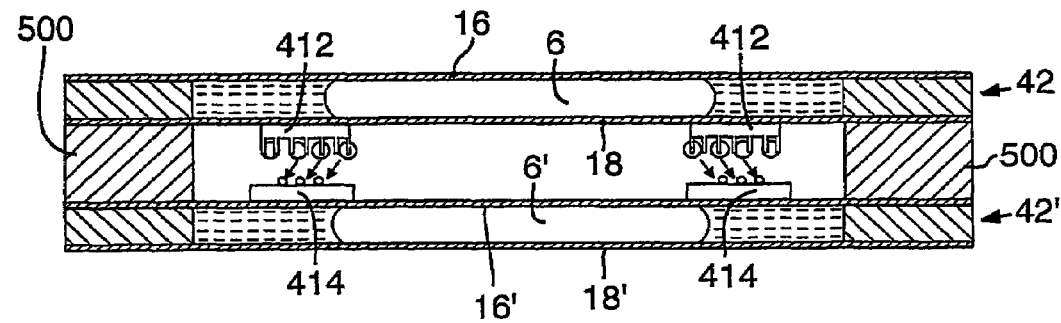

A specific application of the thermal switch 400 is shown in FIGS. 13A and 13B. FIGS. 13A and 13B depict two heat engines 42, 42' arranged in a cascade configuration. A description of the construction and operation of heat engines 42, 42' is given above and therefore is not repeated here. This embodiment differs from previous embodiments in that a thermal switch similar to the thermal switch 400 of FIGS. 12A and 12B is implemented in the instant embodiment to facilitate the transfer of heat between the heat engines.

As shown in FIGS. 13A and 13B, a continuous wall 500 is disposed between the peripheral portions of the heat engines 42, 42' to form a fluid-tight cavity 502. Wicks 412 are mounted on the lower surface of the membrane 18 of the heat engine 42. Heat-transfer contacts 414 are mounted opposite the wicks 412 on the upper surface of the membrane 16' of the heat engine 42'. A working fluid 418 is contained in the cavity 502. A thermal switch is therefore defined by the membrane 18, the membrane 16', the wall 500, the wicks 412, the contacts 414, and the working fluid 418.

For purposes of discussion, the heat engine 42 operates over a higher temperature range than the heat engine 42' so that heat is transferred from the heat engine 42 to the heat engine 42'. The high-temperature side of the heat engine 42 (i.e., membrane 16) is thermally coupled to a high-temperature heat source or to the low-temperature side of another heat engine operating over a higher temperature range. The low-temperature side of the heat engine 42' (i.e., membrane 18') is thermally coupled to a low-temperature heat sink or to the high-temperature side of another heat engine operating over a lower temperature range.

During operation, the working fluid 418 transfers heat from the heat engine 42 to the heat engine 42'. More specifically, referring initially to FIG. 13A, the heat engine 42 is depicted as completing the expansion process and beginning the heat-rejection process, while heat engine 42' is depicted as completing the compression process and beginning the heat-addition process. At the instance shown in FIG. 13A, the membrane 18 is deflected outwardly so that the wicks 412 can contact liquid that has condensed on the heat-transfer contacts 414. Surface tension causes liquid to wick onto the wicks 412 so that, as the membrane 18 returns to its non-deflected position (FIG. 13B), liquid is carried away from the heat-transfer contacts 414. Liquid on the wicks 412 absorbs heat from the heat engine 42 and vaporizes. The vapor-pressure difference in the cavity 502 forces the vapor to flow to the heat-transfer contacts 414, at which the vapor condenses and gives up latent heat to the heat engine 42'. Heat transfer from the heat engine 42 to the heat engine 42' continues until all of the liquid carried by the wicks 412 has evaporated. The heat engine 42 undergoes another heat-rejection process and the heat engine 42' undergoes another heat-addition process when the membrane 18 deflects outwardly to cause wicking of condensed liquid onto the wicks 412.

EXAMPLE 3

In an example of the cascade shown in FIGS. 13A and 13B, the heat engines 42, 42' have the same construction and dimensions as the heat engine described above in Example 1. Photoresist or equivalent material is used to form the wall 406 between the heat engines 42, 42'. The cavity 408 contains about 2 μg of R11 refrigerant, which is sufficient to transfer about 400 μJ of thermal energy from the heat engine 42 to the heat engine 42' in a single thermodynamic cycle. Each wick 412 comprises a layer of photoresist material having a diameter of about 300 μm. Each layer of photoresist material is formed with series of concentric grooves etched to a depth of about 2 μm.

The present invention has been shown in the described embodiments for illustrative purposes only. The present invention may be subject to many modifications and changes without departing from the spirit or essential characteristics thereof. We therefore claim as our invention all such modifications as come within the spirit and scope of the following claims.

We claim:

1. A thermal switch, comprising:
   a heat source;
   a heat sink; and
   at least one liquid-metal droplet disposed between the heat source and the heat sink, the droplet being configured to conduct heat from the heat source to the heat sink whenever the droplet is thermally coupled to the heat source and the heat sink, wherein at least one of the heat source and the heat sink comprises a micro-transducer.

2. The thermal switch of claim 1, wherein the droplet comprises mercury.

3. The thermal switch of claim 1, wherein the droplet is about 10 microns to about 1000 microns in diameter.

4. A thermal switch comprising:
   a heat source comprising a first micro-transducer;
   a heat sink comprising a second micro-transducer; and
   at least one liquid-metal droplet disposed between the heat source and the heat sink, the droplet being configured to transfer heat from the first micro-transducer to the second micro transducer whenever the droplet is thermally coupled to the first micro-transducer and to the second micro-transducer.

5. The thermal switch of claim 4, wherein:
   the droplet is in constant thermal contact with the first micro-transducer; and
   the second micro-transducer comprises a deflectable member that deflects between a deflected position and a non-deflected position, wherein whenever the deflectable member is in the deflected position, the deflectable member contacts the droplet to allow heat to be conducted from the first micro-transducer to the second micro-transducer via the droplet, and whenever the deflectable member is in the non-deflected position, the deflectable member is spaced from the droplet to prevent heat from being conducted from the first micro-transducer to the second micro-transducer via the droplet.

6. The thermal switch of claim 4, wherein:
   the first micro-transducer comprises a first micro-heat engine and the second micro-transducer comprises a second micro-heat engine; and
   heat from the first micro-heat engine is transferred to the second micro-heat engine 5 whenever the droplet is thermally coupled to the first and second micro-heat engines.

7. The thermal switch of claim 6, wherein the first and second micro-heat engines are operable to convert heat energy into electrical energy.

8. The thermal switch of claim 4, wherein:
   the first micro-transducer comprises a first micro-heat pump and the second micro-transducer comprises a second micro-heat pump, and
   heat rejected by the first micro-heat pump is transferred to the second micro-heat pump whenever the droplet is thermally coupled to the first and second micro-heat pumps.

9. A thermal switch comprising:
   a heat source:
   a heat sink; and
   at least one liquid-metal droplet disposed between the heat source and the heat sink, the droplet being configured to conduct heat from the heat source to the heat sink whenever the droplet is thermally coupled to the heat source and the heat sink, wherein the droplet is in constant thermal contact with one of the heat sink and the heat source, and
   the other of the heat sink and the heat source comprises an actuator that selectively thermally contacts the droplet, wherein the actuator comprises a flexible member that is selectively deflectable between a deflected position in which the flexible member contacts the droplet and a non-deflected position in which the flexible member is spaced from the droplet.

10. The thermal switch of claim 9, wherein the flexible member is an electrostatic transducer that deflects and contacts the droplet upon application of a voltage to the thermal switch.

11. A thermal switch for transferring heat into or away from a body comprising:
    a first thermally conductive member;
    a second thermally conductive member; and
    at least one drop of liquid metal that transfers heat into or away from the body whenever the body is thermally coupled to the drop wherein the drop is disposed on the first thermally conductive member, and the second thermally conductive member is movable between a first position and a second position,
    whenever the second thermally conductive member is in the first position, it contacts the drop, thereby allowing heat to be transferred into or away from the body through the thermal switch, and
    whenever the second thermally conductive member is in the second position, it is spaced from the drop to minimize the transfer of heat into or a way from the body through the thermal switch.

12. The thermal switch of claim 11, further comprising an actuator that selectively thermally couples together the drop and the body.

13. The thermal switch of claim 11, wherein the second thermally conductive member is a deflectable member that is operable selectively to deflect toward and away from the first thermally conductive member such that, whenever the deflectable member deflects toward the first thermally conductive member, the deflectable member contacts the drop, and whenever the deflectable member deflects away from the first thermally conductive member, the deflectable member becomes spaced from the drop.

14. The thermal switch of claim 13, wherein:
    the first thermally conductive member comprises at least one electrode; and
    the second thermally conductive member comprises at least one electrode;
    wherein application of a voltage to the electrodes generates an electrostatic charge that causes the second thermally conductive member to deflect toward the first thermally conductive member.

15. The thermal switch of claim 13, wherein:
    the first and second thermally conductive members cooperatively form a fluid-tight cavity therebetween; and
    an insulating gas is contained in the cavity.

16. The thermal switch of claim 15, wherein the insulating gas is argon.

17. The thermal switch of claim 11, wherein the body is a micro-transducer.

* * * * *